(12) United States Patent
Lin et al.

(10) Patent No.: US 12,239,031 B2
(45) Date of Patent: Feb. 25, 2025

(54) MEMORY CELL, SEMICONDUCTOR DEVICE HAVING THE SAME, AND METHODS OF MANUFACTURING THE SAME

(71) Applicant: Taiwan Semiconductor Manufacturing Company, Ltd., Hsinchu (TW)

(72) Inventors: Yu-Chao Lin, Hsinchu (TW); Yu-Sheng Chen, Taoyuan (TW); Da-Ching Chiou, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 566 days.

(21) Appl. No.: 17/380,051

(22) Filed: Jul. 20, 2021

(65) Prior Publication Data

US 2022/0344583 A1 Oct. 27, 2022

Related U.S. Application Data

(60) Provisional application No. 63/178,533, filed on Apr. 23, 2021.

(51) Int. Cl.
*H10N 70/20* (2023.01)
*H01L 23/528* (2006.01)
*H10B 63/10* (2023.01)
*H10N 70/00* (2023.01)

(52) U.S. Cl.
CPC ....... *H10N 70/231* (2023.02); *H01L 23/5283* (2013.01); *H10B 63/10* (2023.02); *H10N 70/063* (2023.02); *H10N 70/8265* (2023.02); *H10N 70/841* (2023.02)

(58) Field of Classification Search
CPC .................................................. H10N 70/8265
See application file for complete search history.

(56) References Cited

U.S. PATENT DOCUMENTS

| | | | |
|---|---|---|---|
| 5,789,758 A * | 8/1998 | Reinberg | G11C 11/5678 257/3 |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |

(Continued)

*Primary Examiner* — Amar Movva
(74) *Attorney, Agent, or Firm* — JCIPRNET

(57) ABSTRACT

A memory cell includes a dielectric structure, a storage element structure, and a top electrode. The storage element structure is disposed in the dielectric structure, and the storage element structure includes a first portion and a second portion. The first portion includes a first side and a second side opposite to the first side, where a width of the first side is less than a width of the second side. The second portion is connected to the second side of the first portion, where a width of the second portion is greater than the width of the first side. The top electrode is disposed on the storage element structure, where the second portion is disposed between the first portion and the top electrode.

20 Claims, 17 Drawing Sheets

(56) References Cited

U.S. PATENT DOCUMENTS 9,576,814 B2    2/2017   Wu et al.
2006/0278895 A1*   12/2006   Burr .................... H01L 23/5256
                                                                257/209

* cited by examiner

MEMORY CELL, SEMICONDUCTOR DEVICE HAVING THE SAME, AND METHODS OF MANUFACTURING THE SAME

CROSS-REFERENCE TO RELATED APPLICATION

This application claims the priority benefit of U.S. provisional application Ser. No. 63/178,533, filed on Apr. 23, 2021. The entirety of the above-mentioned patent application is hereby incorporated by reference herein and made a part of this specification.

BACKGROUND

Developments in shrinking sizes of semiconductor devices and electronic components make the integration of more devices and components into a given volume possible and lead to high integration density of various semiconductor devices and/or electronic components.

Flash memory is a widely used type of nonvolatile memory. However, flash memory is expected to encounter scaling difficulties. Therefore, alternatives types of nonvolatile memory are being explored. Among these alternatives types of nonvolatile memory is phase change memory (PCM). PCM is a type of nonvolatile memory in which a phase of a PCM is employed to represent a unit of data. PCM has fast read and write times, non-destructive reads, and high scalability.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
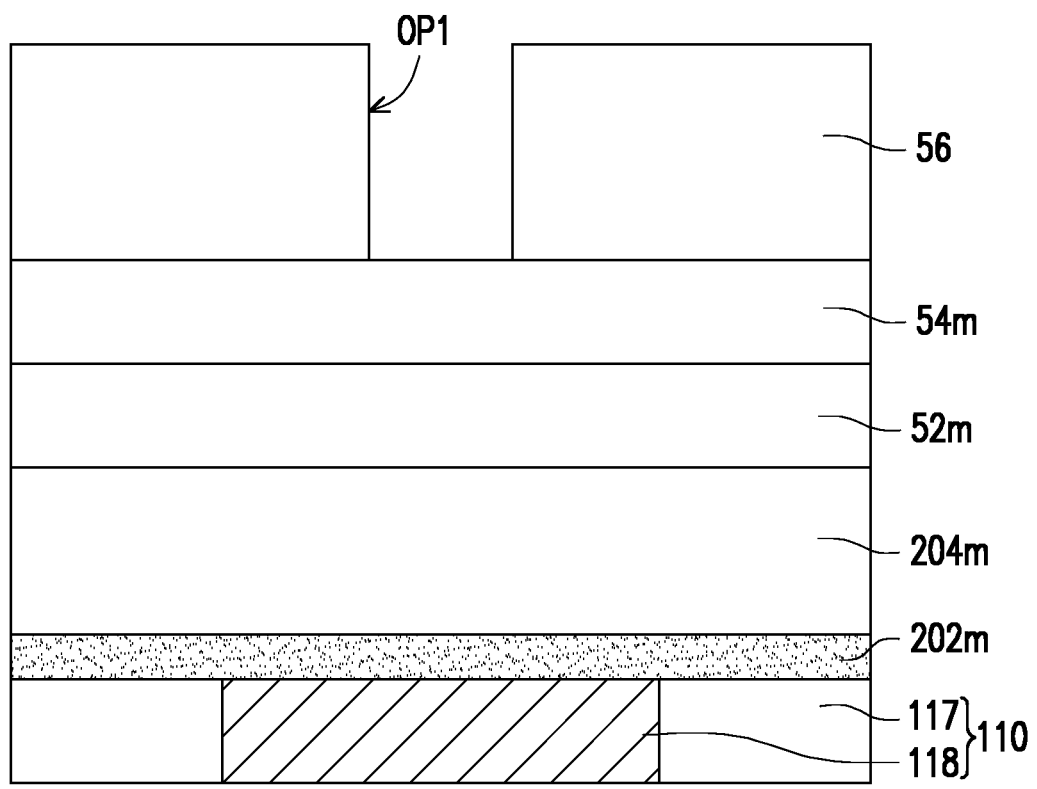
FIG. 1 through FIG. 16 are schematic cross-sectional views showing a method of manufacturing a memory cell in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

It should be appreciated that the following embodiment(s) of the disclosure provides applicable concepts that can be embodied in a wide variety of specific contexts. The specific embodiment(s) discussed herein is merely illustrative and is related to a memory cell, a semiconductor device having the same, and its manufacturing methods. In accordance with some embodiments, in the memory cell, such as a phase-change random access memory (PCRAM) device, a phase change layer is disposed between the top electrode and the conductive feature embedded in the underlying interconnect structure, where the phase change layer is self-heating through input currents provided by the conductive feature. The phase change layer includes a material of a large band-gap which has sufficient resistance to high current and high voltage. In the case, a small critical dimension of a coupling area between the phase change layer and the conductive feature is reduced easily by decreasing a width of a bottom of the phase change layer. By reducing the width of the phase change layer, the heating of the phase change layer is centralized and therefore the reset current is reduced. In addition, since the reset current is reduced, a device density of the memory cell may be increased in a given area without violating the design requirement/constrain (e.g., relevant to the voltage or current overloading issue), thereby further improving the performance of the semiconductor device having the memory cell in the disclosure.

On the other hand, the reduced width of the phase change layer is approached via a specific profile of the phase change layer which requires a specific two-step etching process. In such two-step etching process, a gap-fill process window for the phase change layer is increased, which improves the uniformity of layer deposition so to prevent the void/seam/hole event during forming the phase change layer. In addition, the oxidation at a conventional bottom electrode is avoid. Moreover, with the specific profile, the heating dome of the phase change layer is distant from a location where a top electrode of the memory cell is formed, thereby preventing or suppressing the damage to the heating dome during the formation of the top electrode.

The memory cell illustrated in the following embodiments may be applied to a PCRAM cell, hereinafter referred to as a PCM cell. FIG. 1 through FIG. 16 are schematic cross-sectional views showing a method of manufacturing a memory cell in accordance with some embodiments of the disclosure.

Figure 16:
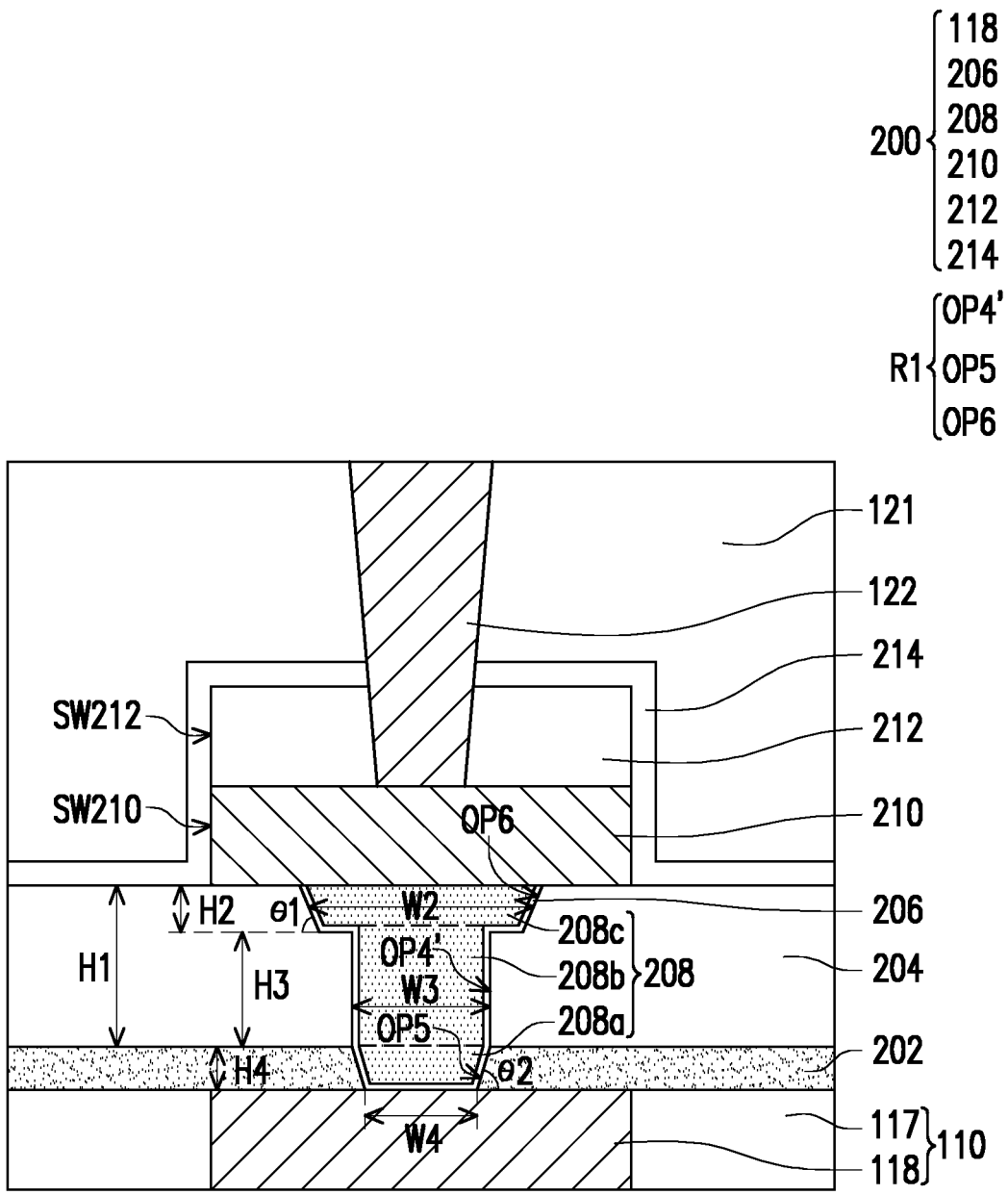

Referring to FIG. 1, in some embodiments, a method of forming a semiconductor device 10 having a memory cell 200 (as shown in FIG. 16) includes following steps. First, an initial structure illustrated in FIG. 1 is provided. The initial structure includes a first interconnect structure 110, a first dielectric material 202m, a second dielectric material 204m, a first photoresist material 52m, a second photoresist material 54m and a photoresist pattern 56.

In detail, the first interconnect structure 110 may include an insulating layer 117 and a conductive layer 118 disposed in the insulating layer 117. In some embodiments, the insulating layer 117 is referred to as an inter-metal dielectric (IMD) layer which may be made of a dielectric material, such as silicon oxide, silicon nitride, silicon oxynitride, a spin-on dielectric material, or a low-k dielectric material. It should be noted that the low-k dielectric materials are generally dielectric materials having a dielectric constant lower than 3.9. The conductive layer 118 may be a conductive line, and the conductive layer 118 may include commonly used conductive materials, such as metals or metal alloys including one or more of Al, AlCu, Cu, Ti, TiN, W, and the like. The conductive layer 118 forms a portion of a current driving circuit (not shown) to provide current to the PCM cell described subsequently.

A seed layer (not shown) may be optionally formed between the insulating layer 117 and the conductive layer 118. That is, for example, the seed layer covers a bottom surface and sidewalls of the conductive layer 118. In some embodiments, the seed layer is a metal layer, which may be a single layer or a composite layer comprising a plurality of sub-layers formed of different materials. In some embodiments, the conductive layer 118 includes copper layer and the seed layer includes a titanium layer and a copper layer over the titanium layer. The seed layer is formed using, for example, physical vapor deposition (PVD) or the like. In one embodiment, the seed layer may be omitted.

In addition, an additional barrier layer or adhesive layer (not shown) may be optionally formed between the conductive layer 118 and the insulating layer 117. Owing to the additional barrier layer or adhesive layer, it is able to prevent the seed layer and/or the conductive layer 118 from diffusing to the underlying layers and/or the surrounding layers. The additional barrier layer or adhesive layer may include Ti, TiN, Ta, TaN, a combination thereof, a multilayer thereof, or the like, and may be formed using (chemical vaper deposition) CVD, atomic layer deposition (ALD), PVD, a combination thereof, or the like. In an alternative embodiment of which the seed layer is included, the additional barrier layer or adhesive layer is interposed between the insulating layer 117 and the seed layer, and the seed layer is interposed between the conductive layer 118 and the additional barrier layer or adhesive layer. In one embodiment, the additional barrier layer or adhesive layer may be omitted.

In some embodiments, the first dielectric material 202m and the second dielectric material 204m are sequentially stacked on the first interconnect structure 110 to cover the first interconnect structure 110. In some embodiments, the first dielectric material 202m and the second dielectric material 204m have different materials. For example, the first dielectric material 202m includes a silicon carbide (SiC) layer and the second dielectric material 204m includes a silicon-rich oxide layer. In some alternative embodiments, the first dielectric material 202m and the second dielectric material 204m have different etching selectivities. In the case, the first dielectric material 202m may be referred to as an etching stop layer to prevent the underlying conductive layer 118 from damage caused by the over-etching.

Continued on FIG. 1, in some embodiments, the first photoresist material 52m, the second photoresist material 54m and the photoresist pattern 56 are stacked on the second dielectric material 204m. The first photoresist material 52m is formed on and in contact with the second dielectric material 204m, for example. The first photoresist material 52m may be formed over the second dielectric material 204m and may be utilized for critical dimension control in order to obtain and control the desired dimensions of the patterning of the second dielectric material 204m and the first dielectric material 202m (not shown in FIG. 1 but illustrated and discussed below with respect to FIGS. 4-7). The first photoresist material 52m may be formed to a thickness of between about 50 nm and about 150 nm, although other suitable thickness may alternatively be utilized. In some embodiments, a material of the first photoresist material 52m includes amorphous carbon formed by a CVD process, although other suitable materials and methods of formation may alternatively be utilized.

The second photoresist material 54m is formed on and in contact with the first photoresist material 52m, in some embodiments. The first photoresist material 52m is sandwiched between (e.g., in physical contact with) the second dielectric material 204m and the second photoresist material 54m, for example. The second photoresist material 54m may be a hard mask utilized to help pattern the first photoresist material 52m and the second dielectric material 204m (not shown in FIG. 1 but illustrated and discussed below with respect to FIGS. 3-4). The second photoresist material 54m may be formed to a thickness of between about 50 nm and about 100 nm, although other suitable thickness may alternatively be utilized. The second photoresist material 54m may be may be a masking material such as silicon oxynitride (SiON), although other suitable materials, such as silicon oxide or silicon nitride, may alternatively be utilized, and may be formed a process such as CVD. However, any other suitable processes may alternatively be utilized.

The photoresist pattern 56 is formed on and in contact with the second photoresist material 54m, for example. As shown in FIG. 1, the photoresist pattern 56 may correspond to the conductive layer 118. That is, the photoresist pattern 56 includes an opening (or referred to as a hole, a via (such as a via opening or a via hole), or a recess) OP1 disposed directly over the conductive layer 118, for example. In some embodiments, a positioning location of the opening OP1 is within a positioning location of the conductive layer 118 in a vertical projection on the first interconnect structure 110 along a stacking direction of the first dielectric material 202m and the second dielectric material 204m. The photoresist pattern 56 may be a photosensitive material utilized to help pattern the second photoresist material 54m (not shown in FIG. 1 but illustrated and discussed below with respect to FIG. 2). The photoresist pattern 56 may be formed to a thickness of between about 50 nm and about 100 nm, although other suitable thickness may alternatively be utilized. The photoresist pattern 56 may be may be a positive resist material or a negative resist material, that is suitable for a patterning process such as a photolithography process with a mask or a mask-less photolithography process (for instance, an electron-beam (e-beam) writing or an ion-beam writing), and may be formed by any suitable method, such as spin-coating or the like. However, other suitable materials and methods of forming the photoresist pattern 56 may alternatively be utilized. In some embodiments, the first photoresist material 52m, the second photoresist material 54m and the photoresist pattern 56 are collectively referred to as a photoresist layer having a tri-layer structure.

Figure 2:
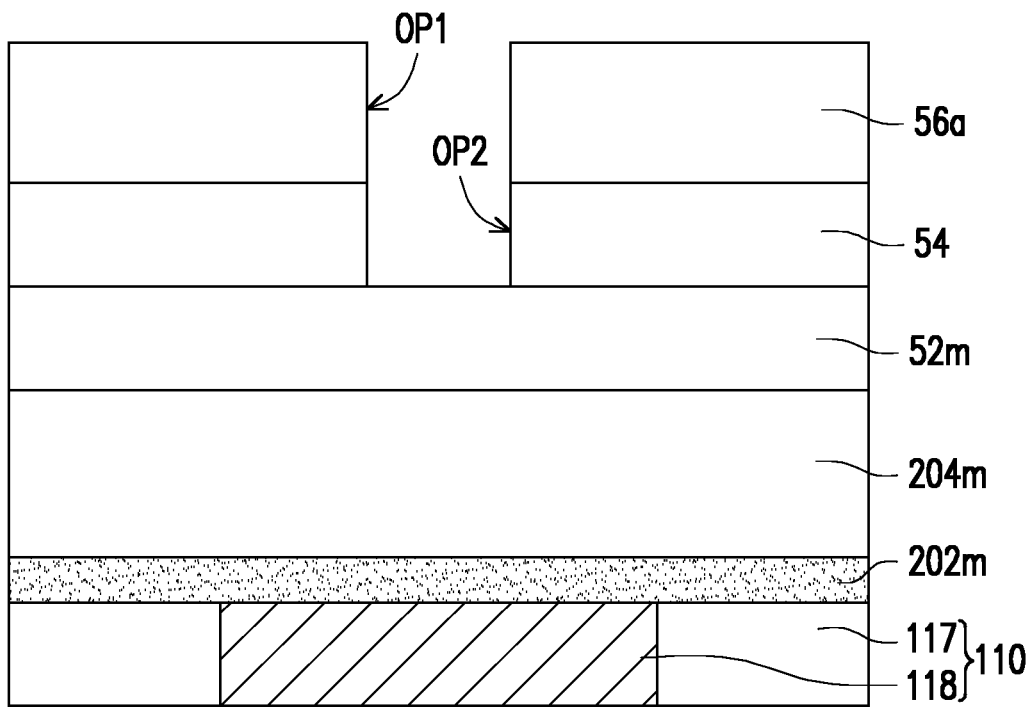

Referring to FIG. 1 and FIG. 2, in some embodiments, the second photoresist material 54m is patterned by using the photoresist pattern 56 as a mask. In the case, as shown in FIG. 2, a portion of the second photoresist material 54m is removed to form a hard mask layer 54 having an opening (or referred to as a hole, a via (such as a via opening or a via hole), or a recess) OP2, where the first photoresist material 52m is exposed by the opening OP2 formed in the hard mask layer 54 and the opening OP1 formed in the photoresist pattern 56a thereon. As shown in FIG. 2, the opening OP1 may be directly above and spatially communicated with the opening OP2, where sidewalls of the opening OP1 and OP2 may be substantially aligned with one another within the process variations. The photoresist pattern 56 may be consumed during the patterning, thus the photoresist pattern 56a may have a thickness less than the thickness of the photoresist pattern 56. The patterning process may include an etching process, such as a dry etching, a wet etching or a combination thereof.

Figure 3:
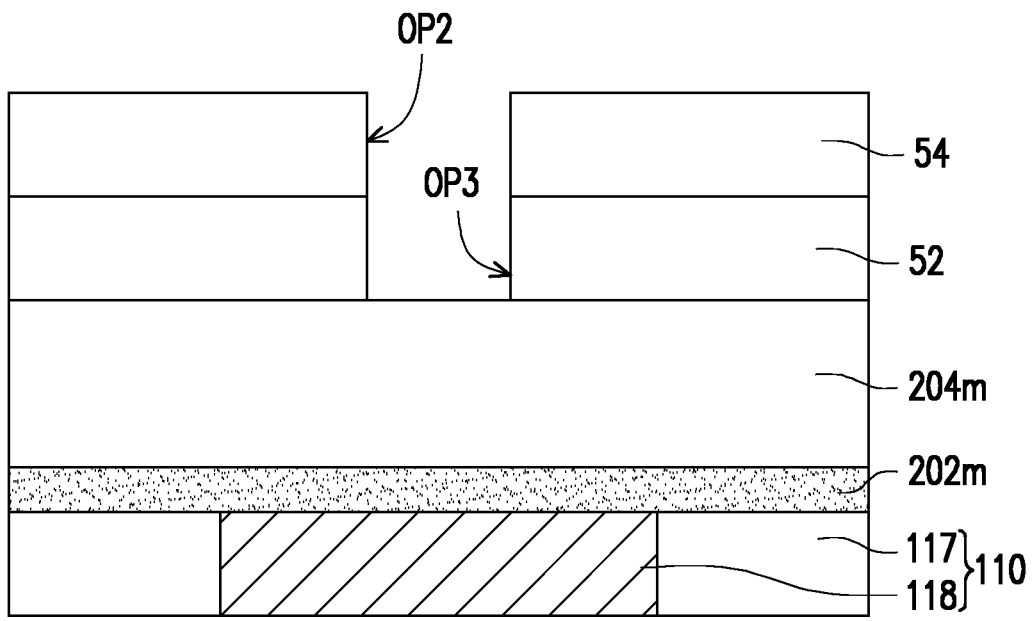

Referring to FIG. 2 and FIG. 3, in some embodiments, the first photoresist material 52m is patterned by using the hard mask layer 54 as a mask. In the case, as shown in FIG. 3, a portion of the first photoresist material 52m is removed to form an anti-reflective deposition (ARD) layer 52 having an opening (or referred to as a hole, a via (such as a via opening or a via hole), or a recess) OP3, where the second dielectric material 204m is exposed by the opening OP3 formed in the ARD layer 52 and the opening OP2 formed in the hard mask layer 54 thereon. As shown in FIG. 3, the opening OP2 may be directly above and spatially communicated with the opening OP3, where sidewalls of the opening OP2 and OP3 may be substantially aligned with one another within the process variations. The photoresist pattern 56a may be removed during patterning the first photoresist material 52m. The patterning process may include ashing process, such as using $O_2$ ashing, $N_2$ ashing, $H_2$ ashing, $CO_2$ ashing, or the like, although any other suitable patterning processes may alternatively be utilized. The patterning process may include a dry etching, a wet etching or a combination thereof. Alternatively, the patterning process may be performed by a dry chemical etch with a plasma source and an etchant gas.

The plasma source may be a capacitively coupled plasma (CCP) etch, an inductively coupled plasma (ICR) etch, a transformer coupled plasma (TCP) etch, an electron cyclotron resonance (ECR) etch, a reactive ion etch (RIE), or the like. In one embodiment, the process for patterning the first photoresist material 52m to obtain the opening OP3 is performing a plasma etch at a pressure in a range from about 5 mTorr to about 40 mTorr, at a power in a range from about 400 watts (W) to about 800 watts, with an etching bias in a range from about 100 volts (V) to about 300 volts, with a plasmas flow including from about 10 standard cubic centimeters per minute (sccm) to about 80 sccm of $C_4F_8$, about 10 sccm to about 20 sccm of $CF_4$, about 3 sccm to about 20 sccm of $O_2$, and from about 50 sccm to about 200 sccm of $N_2$.

Figure 4:
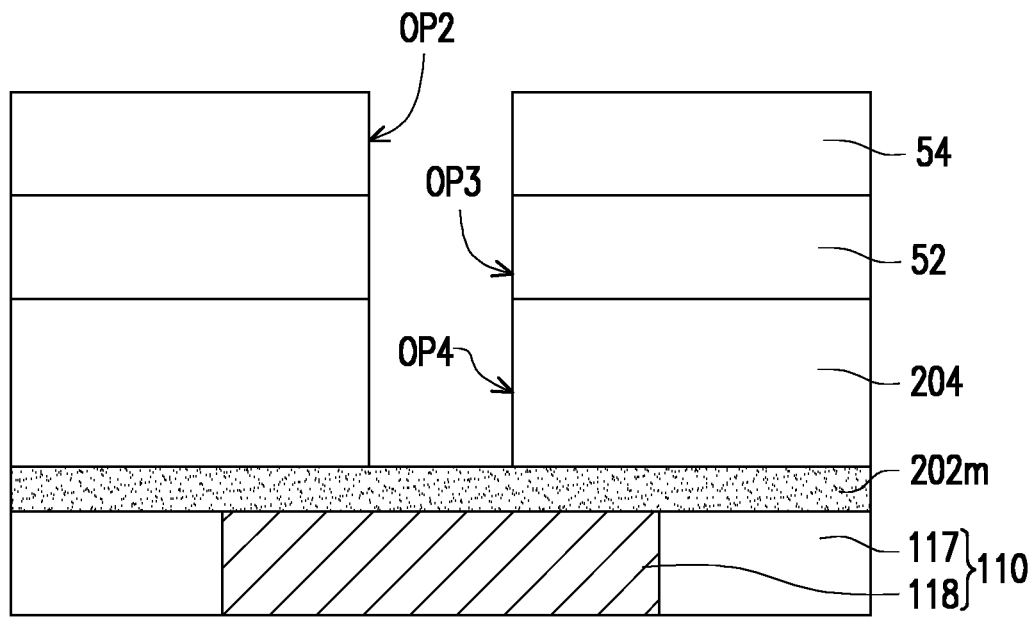

Referring to FIG. 3 and FIG. 4, in some embodiments, the second dielectric material 204m is patterned by using the ARD layer 52 and the hard mask layer 54 as a mask. In the case, a portion of the second dielectric material 204m is removed to form a second dielectric layer 204 having an opening (or referred to as a hole, a via (such as a via opening or a via hole), or a recess) OP4. For example, the first dielectric material 202m is exposed by the opening OP4 formed in the second dielectric layer 204, the opening OP3 formed in the ARD layer 52, and the opening OP2 formed in the hard mask layer 54 sequentially thereon. As shown in FIG. 4, the opening OP4 may be directly below and spatially communicated with the openings OP2 and OP3, where sidewalls of the opening OP2, OP3 and OP4 may be substantially aligned with one another within the process variations. The opening OP4 penetrates through the second dielectric layer 204, in some embodiments.

The patterning process may include a dry etching, a wet etching or a combination thereof. Alternatively, the patterning process may be performed by a dry chemical etch with a plasma source and an etchant gas. The plasma source may be a CCP etch, an ICR etch, a TCP etch, an ECR etch, a RIE, or the like. In one embodiment, the process for patterning the second dielectric material 204m to obtain the opening OP4 is performing a plasma etch at a pressure in a range from about 10 mTorr to about 40 mTorr, at a power in a range from about 800 watts to about 1200 watts, with an etching bias in a range from about 300 volts to about 500 volts, with a plasmas flow including from about 40 sccm to about 80 sccm of $C_4F_6$, and from about 10 sccm to about 20 sccm of $CF_4$. After forming the second dielectric layer 204, the hard mask layer 54 may be removed by etching (such as a dry etching, a wet etching or a combination thereof).

Figure 5:
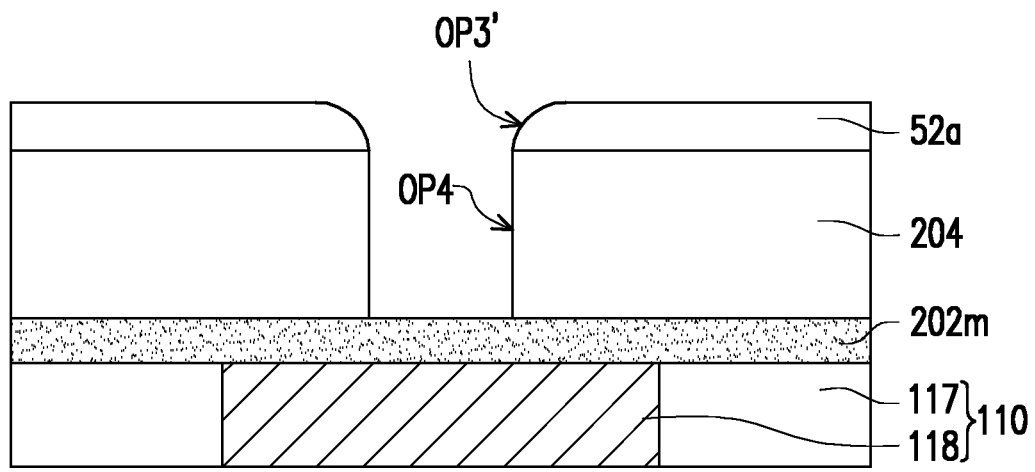

Referring to FIG. 5, in some embodiments, the ARD layer 52 is trimmed to form an ARD layer 52a. The ARD layer 52 is patterned to form the ARD layer 52a with an opening (or referred to as a hole, a via (such as a via opening or a via hole), or a recess) OP3', where the opening OP3' has an opening size (in a horizontal direction) gradually increasing in a direction from an illustrated bottom surface of the ARD layer 52a towards an illustrated top surface of the ARD layer 52a, in some embodiments. The ARD layer 52 may be consumed during the patterning, thus the ARD layer 52a may have a thickness less than the thickness of the ARD layer 52. As shown in FIG. 5, sidewalls of the opening OP3' formed in the ARD layer 52a may be curved sidewalls. Alternatively, the sidewalls of the opening OP3' formed in the ARD layer 52a may be slant, non-curved sidewalls. As shown in FIG. 5, the opening OP3' may be directly above and spatially communicated with the opening OP4. In one embodiment, the patterning process for trimming the ARD layer 52 to obtain the opening OP3' is performing a plasma etch at a pressure in a range from about 20 mTorr to about 80 mTorr, at a power in a range from about 800 watts to about 1200 watts, with an etching bias in a range from about 0 volts to about 100 volts, with a plasmas flow including from about 400 sccm to about 2000 sccm of $CO_2$.

Figure 6:
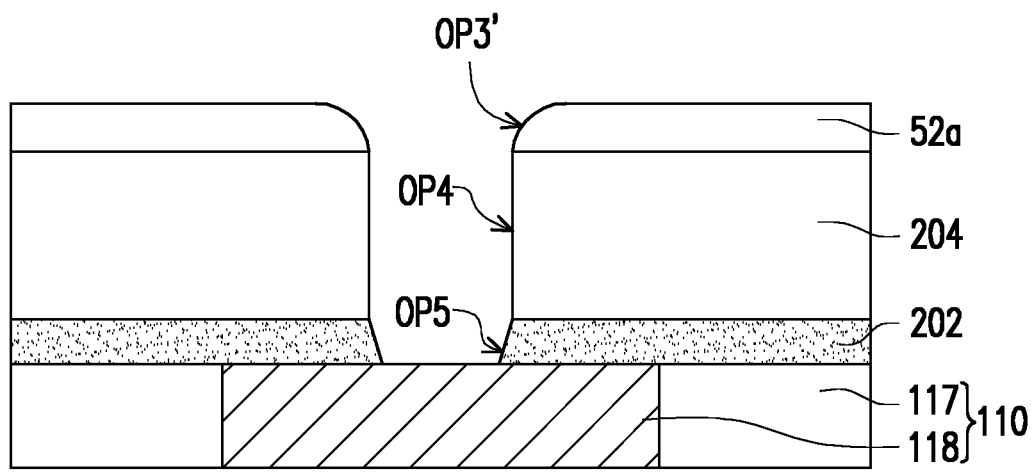

Referring to FIG. 5 and FIG. 6, in some embodiments, the first dielectric material 202m is patterned by using the ARD layer 52a as a mask. In the case, a portion of the first dielectric material 202m is removed to form a first dielectric layer 202 having an opening (or referred to as a hole, a via (such as a via opening or a via hole), or a recess) OP5. For example, the conductive layer 118 is exposed by the opening OP5 formed in the first dielectric layer 202, the opening OP4 formed in the second dielectric layer 204, and the opening OP3' formed in the ARD layer 52a sequentially thereon. The opening OP5 has an opening size (in a horizontal direction) gradually increasing in a direction from an illustrated bottom surface of the first dielectric layer 202 towards an illustrated top surface of the first dielectric layer 202, in some embodiments. As shown in FIG. 6, sidewalls of the opening OP5 formed in the first dielectric layer 202 may be slant sidewalls. Alternatively, the sidewalls of the opening OP5 formed in the first dielectric layer 202 may be curved sidewalls. As shown in FIG. 6, the opening OP5 may be directly below and spatially communicated with the openings OP3' and OP4. The opening OP5 penetrates through the first dielectric layer 202, in some embodiments.

The patterning process may include a dry etching, a wet etching or a combination thereof. Alternatively, the patterning process may be performed by a dry chemical etch with a plasma source and an etchant gas. The plasma source may be a CCP etch, an ICR etch, a TCP etch, an ECR etch, a RIE, or the like. In one embodiment, the process for patterning the first dielectric material 202m to obtain the opening OP5 is performing a plasma etch at a pressure in a range from about 5 mTorr to about 20 mTorr, at a power in a range from about 600 watts to about 1000 watts, with an etching bias in a range from about 100 volts to about 300 volts, with a plasmas flow including from about 20 sccm to about 100 sccm of $Cl_2$, and from about 20 sccm to about 200 sccm of Ar.

Figure 7:
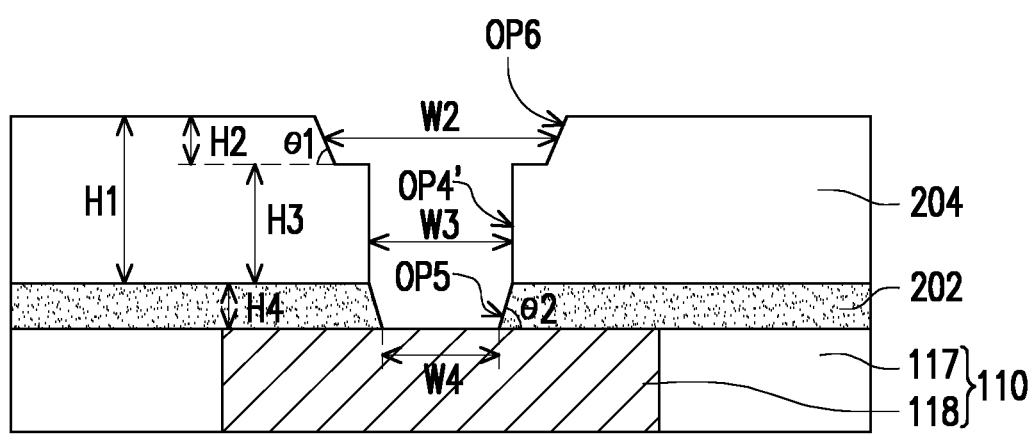

Referring to FIG. 6 and FIG. 7, in some embodiments, the ARD layer 52a is removed from the second dielectric layer 204, where an illustrate top surface of the second dielectric layer 204 is accessibly revealed. In some embodiments, during removing the ARD layer 52a, a portion of the second dielectric layer 204 is also removed to form a trench OP6 in the second dielectric layer 204, where the trench OP6 extends into the second dielectric layer 204 from the illustrated top surface of the second dielectric layer 204. The trench OP6 has an opening size (in a horizontal direction) gradually increasing in a direction from an illustrated bottom surface of the second dielectric layer 204 towards the illustrated top surface of the second dielectric layer 204, in some embodiments. As shown in FIG. 7, sidewalls of the trench OP6 formed in the second dielectric layer 204 may be slant sidewalls. Alternatively, the sidewalls of the trench OP6 formed in the second dielectric layer 204 may be curved sidewalls.

During the formation of the trench OP6, a portion of the opening OP4 is consumed, and the rest of the opening OP4 is referred to as an opening (or referred to as a hole, a via (such as a via opening or a via hole), or a recess) OP4', for example. As shown in FIG. 7, the trench OP6 may be directly above the and spatially communicated with the openings OP4' and OP5. In some embodiments, the trench OP6 and the opening OP4' together penetrate through the second dielectric layer 204. In other words, owing to the trench OP6 and the opening OP4', the recess R1 has a double trench profile in the second dielectric layer 204. In some embodiments, the trench OP6 and the openings OP4' and OP5 together constitute a recess R1 formed in and penetrating through a dielectric structure including the first dielectric layer 202 and the second dielectric layer 204 stacked thereon. As shown in FIG. 7, the conductive layer 118 may be exposed by the recess R1. In addition, the openings OP4', OP5 and the trench OP6 includes in the recess R1 independently may have a round, elliptical, square, rectangular or polygonal profile in a top view.

The opening OP4' may be referred to as a middle portion of the recess R1. The opening OP4' may have a lateral size W3 approximately ranging from 30 nm to 40 nm and a height H3 approximately ranging from 30 nm to 50 nm, as shown in FIG. 7. The lateral size W3 may be referred to as a width W3. For example, the width W3 is substantially constant along the direction from the illustrate bottom surface of the second dielectric layer 204 towards the illustrated top surface of the second dielectric layer 204. In some embodiments, sidewalls of the opening OP4' are vertical sidewalls.

The opening OP5 may be referred to as a lower portion of the recess R1, which may be directly disposed below the opening OP4'. The opening OP5 has a bottom opening at the conductive layer 118 and a top opening at the opening OP4', where the top opening of the opening OP5 has a width (not label) substantially equal to the width W3 of the opening OP4' and greater than a width of the bottom opening of the opening OP5, for example. As shown in FIG. 7, the bottom opening of the opening OP5 may have a lateral size W4 approximately ranging from 10 nm to 20 nm and a height H4 approximately ranging from 5 nm to 20 nm. The lateral size W4 may be referred to as a width W4. The height H4 of the opening OP5 is the height of the first dielectric layer 202, for example. In some embodiments, an angle θ2 between the illustrate bottom surface of the first dielectric layer 202 and the sidewall of the opening OP5 is approximately ranging from 45° to 60°.

The trench OP6 may be referred to as an upper portion of the recess R1, which may be directly disposed on the opening OP4'. The trench OP6 has a bottom opening at the opening OP4' and a top opening at a plane including the illustrated top surface of the second dielectric layer 204, where the bottom opening of the trench OP6 has a width (not label) substantially equal to the width W3 of the opening OP4' and less than a width of the top opening of the trench OP6, for example. As shown in FIG. 7, the top opening of the trench OP6 may have a lateral size W2 approximately ranging from 50 nm to 100 nm and a height $H_2$ approximately ranging from 20 nm to 40 nm. The lateral size W2 may be referred to as a width W2. In some embodiments, an angle θ1 between a sidewall of the trench OP6 and a plane including an illustrated top opening of the opening OP4' is approximately ranging from 30° to 60°. The angle θ1 is located outside of the trench OP6 and the opening OP4'. A sum of the height $H_2$ of the trench OP6 and the height H3 of the opening OP4' is a height H1 of the second dielectric layer 204, for example. The height H1 of the second dielectric layer 204 may be approximately ranging from 50 nm to 90 nm, such as from about 50 nm to about 80 nm. In some embodiments, the sidewalls of the trench OP6 are not connected to the sidewalls of the opening OP4'. For example, the sidewalls of the trench OP6 are laterally offset from the sidewalls of the opening OP4' by a distance greater than zero, as shown in FIG. 7.

Referring back to FIG. 7, the removal process may include etching (such as a dry etching, a wet etching or a combination thereof) and/or ashing. Alternatively, the removal process may be performed by a dry chemical etch with a plasma source and an etchant gas. The plasma source may be a CCP etch, an ICR etch, a TCP etch, an ECR etch, a RIE, or the like. In one embodiment, the process for removing the ARD layer 52a to obtain the trench OP6 is performing a plasma etch at a pressure in a range from about 20 mTorr to about 80 mTorr, at a power in a range from about 400 watts to about 800 watts, with an etching bias in a range from about 50 volts to about 150 volts, with a plasmas flow including from about 400 sccm to about 2000 sccm of $CO_2$.

After the removal of the ARD layer 52a, a cleaning step may be optionally performed on the structure depicted in FIG. 7 to clean and remove the residue generated from the removal step. In one embodiment, the process for cleaning the residue generated from the removal step is performing a $N_2$—$O_2$ flush at a pressure in a range from about 40 mTorr to about 80 mTorr, at a power in a range from about 600 watts to about 1200 watts, with an etching bias in a range from about 40 volts to about 150 volts, with a plasmas flow including from about 200 sccm to about 1000 sccm of $N_2$, and from about 10 sccm to about 40 sccm of $O_2$. However, any other suitable clean processes may alternatively be utilized.

Figure 8:
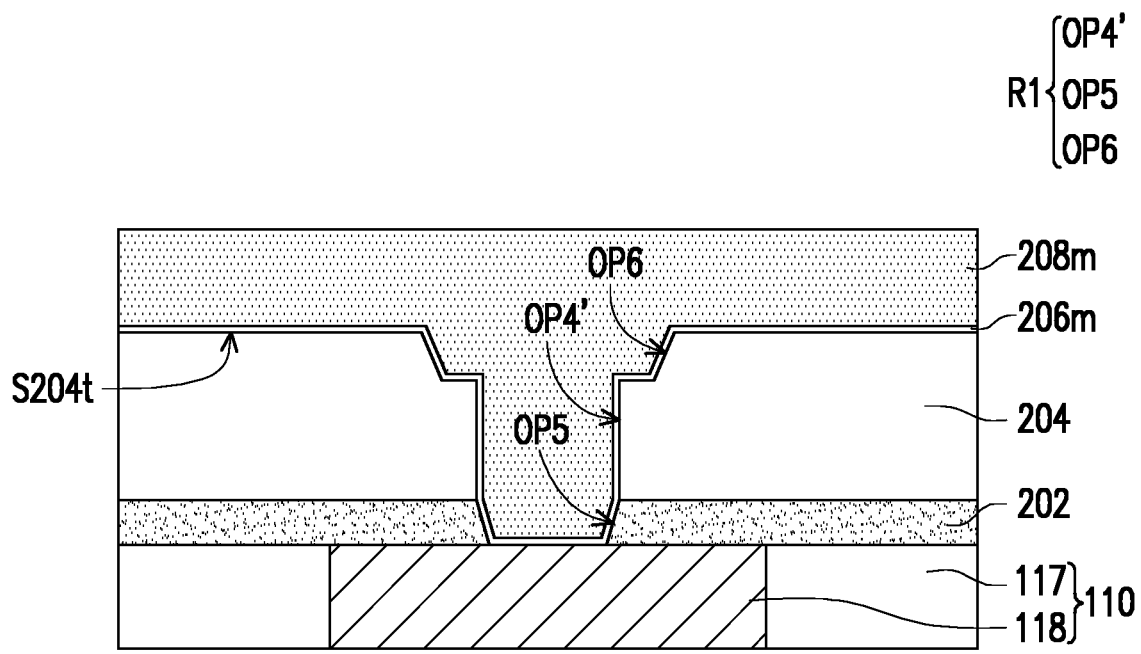

Referring to FIG. 8, in some embodiments, a barrier material 206m and a storage element material 208m are sequentially formed on the second dielectric layer 204 and further extend into the recess R1. The second dielectric layer 204 is covered by (e.g., not accessibly revealed by) the storage element material 208m and the barrier material $206_m$, for example. The barrier material 206m is conformally formed over the second dielectric layer 204, which extends on a top surface S204t of the second dielectric layer 204 and further extends into the recess R1 to be in contact with the conductive layer 118, for example. In other words, the recess R1 may be lined with at least a portion of the barrier material 206m. The barrier material 206m may include Ti, TiN, Ta, TaN, a combination thereof, a multilayer thereof, or the like, and may be formed using CVD, ALD, PVD, a combination thereof, or the like. As shown in FIG. 8, the barrier material 206m may be TaN formed by PVD, although any other suitable materials and processes may alternatively be utilized.

Thereafter, the storage element material 208m is formed on and in contact with the barrier material 206m, in some embodiments. As shown in FIG. 8, the storage element material 208m extends on the barrier material 206m over the top surface S204t and further fills the recess R1. In other words, the barrier material 206m is sandwiched between the storage element material 208m and the second dielectric layer 204, sandwiched between the storage element material 208m and the first dielectric layer 202, and sandwiched between the storage element material 208m and the conductive layer 118. In some embodiments, the storage element material 208m includes a phase change material when the memory cell 200 (FIG. 16) is the PCM cell. Due to the recess R1, a processing window of depositing the barrier material 206m and the storage element material 208m is increased, thereby improving their uniformity of layer deposition. Thus, the void/seam/hole event generally occurred in the deposition process(es) of a storage element material and/or a barrier material is prevented.

The phase change material of the storage element material 208m may include a chalcogenide material, such as an indium (In)-antimony (Sb)-tellurium (Te) (IST) material doped with Si (e.g., Si-IST), an IST material doped with Ge (e.g., Ge-IST), a germanium (Ge)-antimony (Sb)-tellurium (Te) (GST) material doped with Si (e.g., Si-GST), or a GST material doped with Ge (e.g., Ge-GST). The ISG material may include $In_2Sb_2Te_5$, $InISb_2Te_4$, $InISb_4Te_7$, or the like. The GST material may include $Ge_8Sb_5Te_8$, $Ge_2Sb_2Te_5$, $Ge_1Sb_2Te_4$, $Ge_1Sb_4Te_7$, $Ge_4Sb_4Te_7$, $Ge_4SbTe_2$, $Ge_6SbTe_2$, or the like. The hyphenated chemical composition notation, as used herein, indicates the elements included in a particular mixture or compound, and is intended to represent all stoichiometries involving the indicated elements. The storage element material 208m may be formed by any suitable method, such as PVD, ALD, or the like. However, the disclosure is not limited thereto; alternatively, any other suitable phase change material and forming method may be utilized as long as the phase change material has sufficient resistances to high current and high voltage. For example, the phase change material of the storage element material 208m is a large band-gap material being capable of standing with high current and high voltage during the operation of the memory cell 200 (as shown in FIG. 16). As shown in FIG. 8, the storage element material 208m may be Si-doped or Ge-doped GST formed by PVD, although any other suitable materials and processes may alternatively be utilized.

Figure 9:
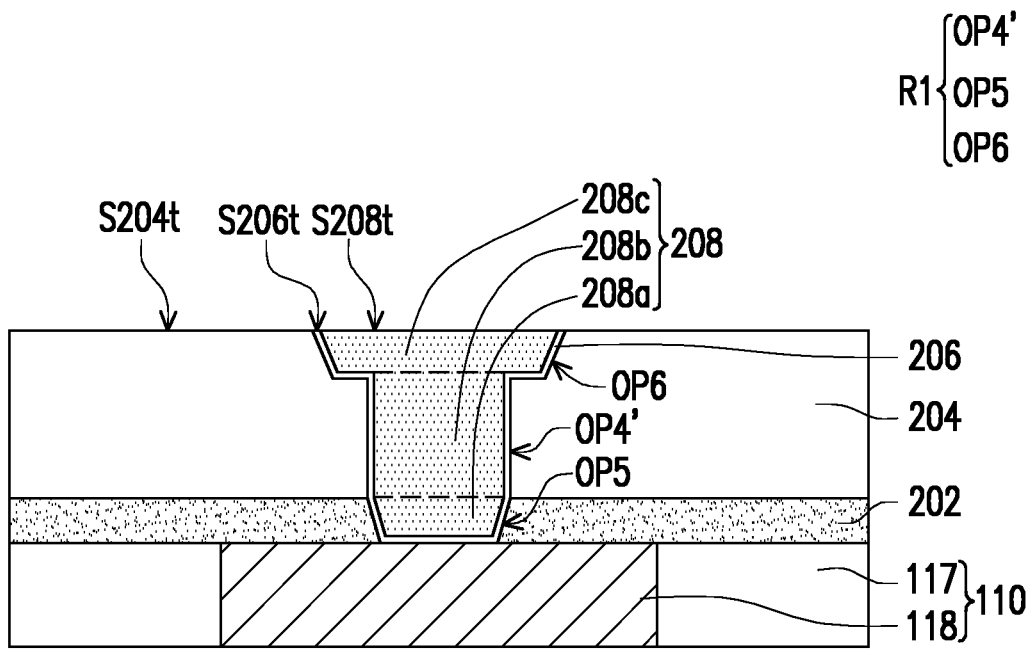

Referring to FIG. 8 and FIG. 9, in some embodiments, a planarization step (e.g., a CMP process) is performed to remove portions of the storage element material 208m and the barrier material 206m over a plane including the top surface S204t of the second dielectric layer 204, thereby forming a barrier layer 206 and a storage element layer (may referred to as a storage element structure) 208 inside the recess R1. In some embodiments, a top surface S208t of the storage element layer 208 and a top surface S206t of the barrier layer 206 are substantially coplanar to and leveled with the top surface S204t of the second dielectric layer 204 within the process variations. As shown in FIG. 9, the second dielectric layer 204 is accessibly revealed by the storage element layer 208 and the barrier layer 206, for example. During the planarization step, the second dielectric layer 204 may also be partially polarized. After the planarization step, a cleaning step may be optionally performed to clean and remove the residue generated from the planarization step. Due to the barrier layer 206, it is able to prevent the storage element layer 208 from diffusing to the underlying layers and/or the surrounding layers.

The storage element layer 208 may include a first portion 208a disposed in the opening OP5 formed in the first dielectric layer 202, a second portion 208b disposed in the opening OP4' formed in the second dielectric layer 204, and a third portion 208c disposed in the trench OP6 formed in the second dielectric layer 204, where the second portion 208b connects the first portion 208a and the third portion 208c, as shown in FIG. 9. In some embodiments, the first portion 208a and the second portion 208b are together referred to as a via portion of the storage element layer 208, and the third portion 208c is referred to as a trench portion of the storage element layer 208. Due to a critical dimension of the third portion 208c is minimized (e.g., within a range of about 10 nm to about 20 nm), the coupling area between the storage element layer 208 and the conductive layer 118 is reduced, thus the heating of the storage element layer 208 directly induced by the current provided from the conductive layer 118 is centralized. In the case, the storage element layer 208 and the barrier layer 206 together is referred to a heater adopting the profile of the recess R1 (previously described in FIG. 7), where the storage element layer 208 is referred to as a heating heart of the heater; and thus, the details of the heater's profile are not repeated herein for simplicity. In some embodiments, the heater including the storage element layer 208 and the barrier layer 206 is coupled to or in contact with the conductive layer 118. The heater is configured to generate heat in proportion to a current applied across the heater. However, the disclosure is not limited thereto; in an alternative embodiment of which the barrier layer 206 is omitted, the storage element layer 208 itself is referred to a heater adopting the profile of the recess R1. The storage element layer 208 may be referred to as a memory layer or structure of the memory cell 200.

Figure 10:
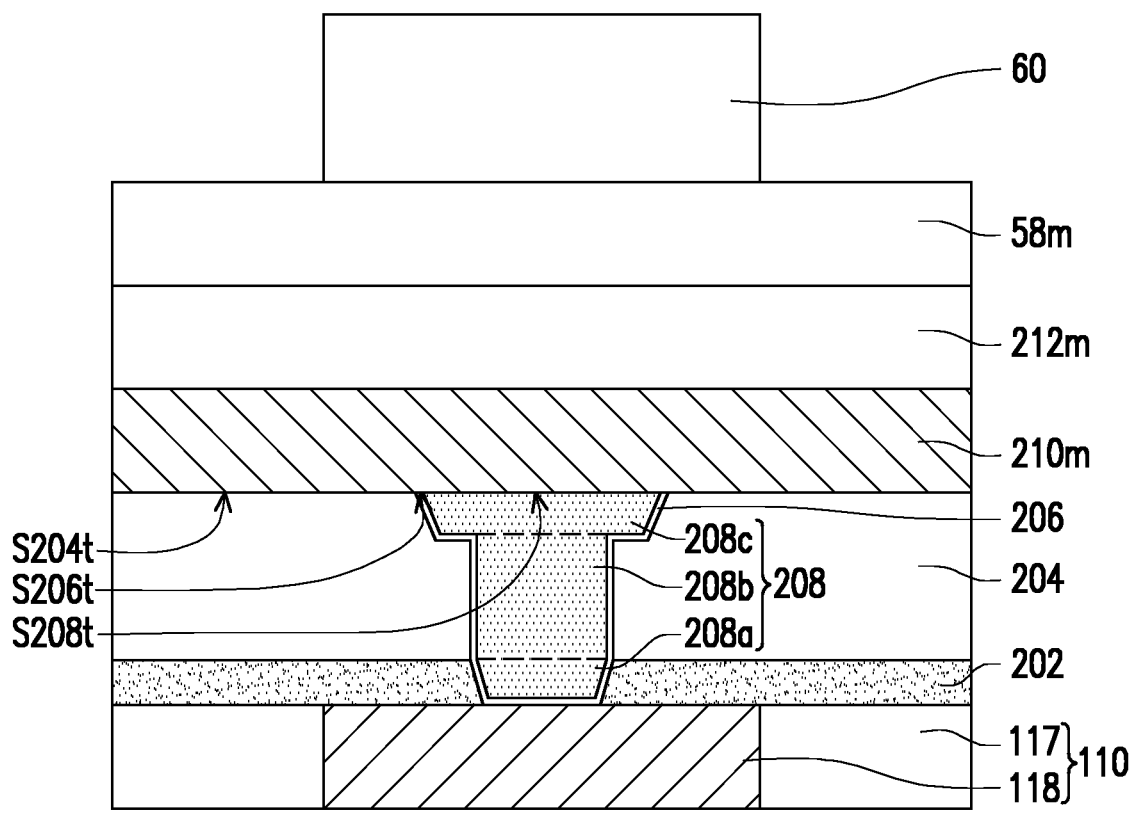

Referring to FIG. 10, in some embodiments, a stack structure is formed on the storage element layer 208, the barrier layer 206, and the second dielectric layer 204. For example, the stack structure includes a top electrode material 210m, a hard mask material 212m, a bottom anti-reflection coating (BARC) 58m, and a photoresist pattern 60. The stack structure may be referred to as a stack of multiple material layers, where more or less material layers may be included in the stack structure based on the design requirement and demand, the disclosure is not limited thereto.

The top electrode material 210m is formed on and in contact with the top surface S208t of the storage element layer 208, the top surface S206t of the barrier layer 206 and the top surface S204t of the second dielectric layer 204, for example. In some embodiments, the storage element layer 208 is disposed between the conductive layer 118 and the top electrode material 210m. In some embodiments, the barrier layer 206 is disposed between the conductive layer 118 and the storage element layer 208. The top electrode material 210m may include a conductive material, such as Ti, Co, Cu, AlCu, W, WN, TiN, TiW, TiAl, TiAlN, or a combination thereof. For example, the top electrode material 210m is made of TiN. For another example, the top electrode material 210m is made of W or WN. The top electrode material 210m may be formed by any suitable method, such as CVD, PVD, or the like. The top electrode material 210m may have a thickness of about 10 nm to about 30 nm, although other suitable thickness may alternatively be utilized.

The hard mask material 212m is formed on and in contact with the top electrode material 210m, for example. In some embodiments, the top electrode material 210m is disposed between (e.g., in physical contact with) the storage element layer 208 and the hard mask material 212m, disposed between (e.g., in physical contact with) the barrier layer 206 and the hard mask material 212m, and disposed between (e.g., in physical contact with) the second dielectric layer 204 and the hard mask material 212m. In some embodiments, the hard mask material 212m includes an inorganic dielectric material, such as SiON, SiN, SiC, SiOC, SiCN, or a combination thereof. The hard mask material 212m may be formed by any suitable method, such as CVD. The hard mask material 212m may have a thickness of about 20 nm to about 50 nm, although other suitable thickness may alternatively be utilized.

The BARC 58m is formed on and in contact with the hard mask material 212m, for example. In some embodiments, the hard mask material 212m is disposed between (e.g., in physical contact with) the BARC 58m and the top electrode material 210m. The BARC 58m may be formed by any suitable method, such as CVD, spin-on, or the like. The BARC 58m may have a thickness of about 20 nm to about 40 nm, although other suitable thickness may alternatively be utilized.

The photoresist pattern 60 is formed on and in contact with the BARC 58m, for example. In some embodiments, the BARC 58m is disposed between (e.g., in physical contact with) the hard mask material 212m and the photoresist pattern 60 to reduce reflection. As shown in FIG. 10, the photoresist pattern 60 may correspond to the storage element layer 208. That is, the photoresist pattern 60 is disposed directly over the storage element layer 208. In some embodiments, a positioning location of the photoresist pattern 60 is overlapped with a positioning location of the conductive layer 118 in a vertical projection on the first interconnect structure 110 along a stacking direction of the first dielectric layer 202 and the second dielectric layer 204. In some embodiments, the formation and material of the photoresist pattern 60 are similar to or substantially identical to the formation and material of the photoresist pattern 56 previous described in FIG. 1, and thus are not repeated herein for brevity. The photoresist pattern 60 may have a thickness of about 50 nm to about 90 nm, although other suitable thickness may alternatively be utilized.

Figure 11:
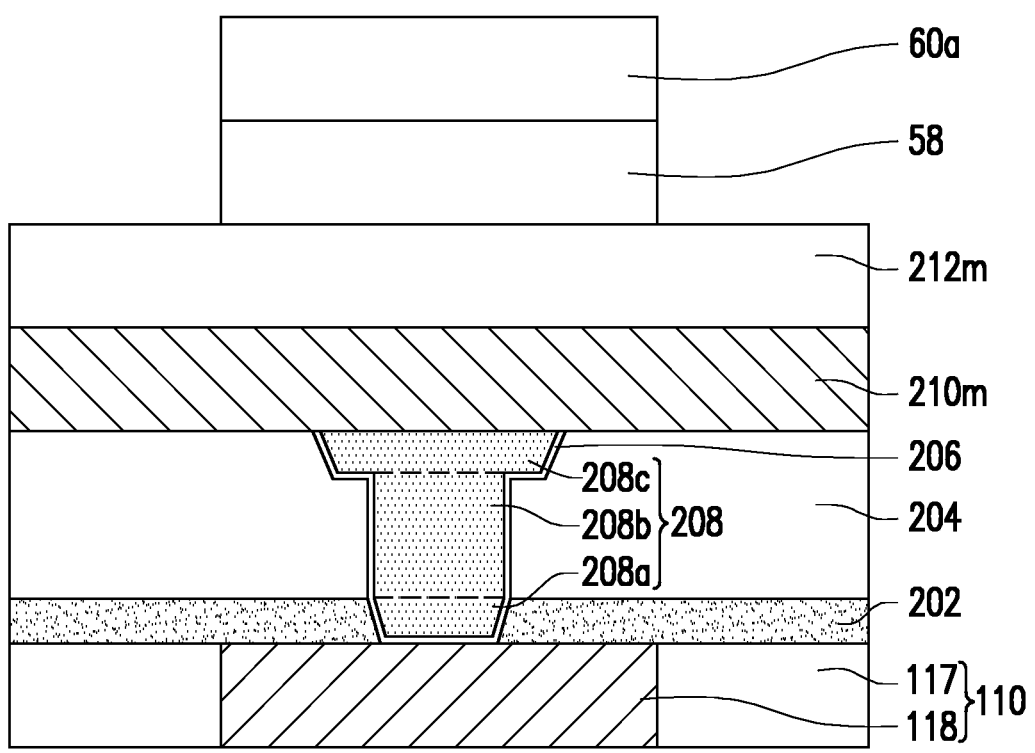

Referring to FIG. 10 and FIG. 11, the BARC 58m is patterned by using the photoresist pattern 60 as a mask. In the case, as shown in FIG. 11, a portion of the BARC 58m is removed, and the hard mask material 212m is exposed by a BARC 58 and a photoresist pattern 60a thereon. The photoresist pattern 60 may be consumed during the patterning, thus the photoresist pattern 60a may have a thickness less than the thickness of the photoresist pattern 60. The patterning may include an etching process (such as a dry etching, a wet etching, or a combination thereof) and/or an ashing process.

Figure 12:
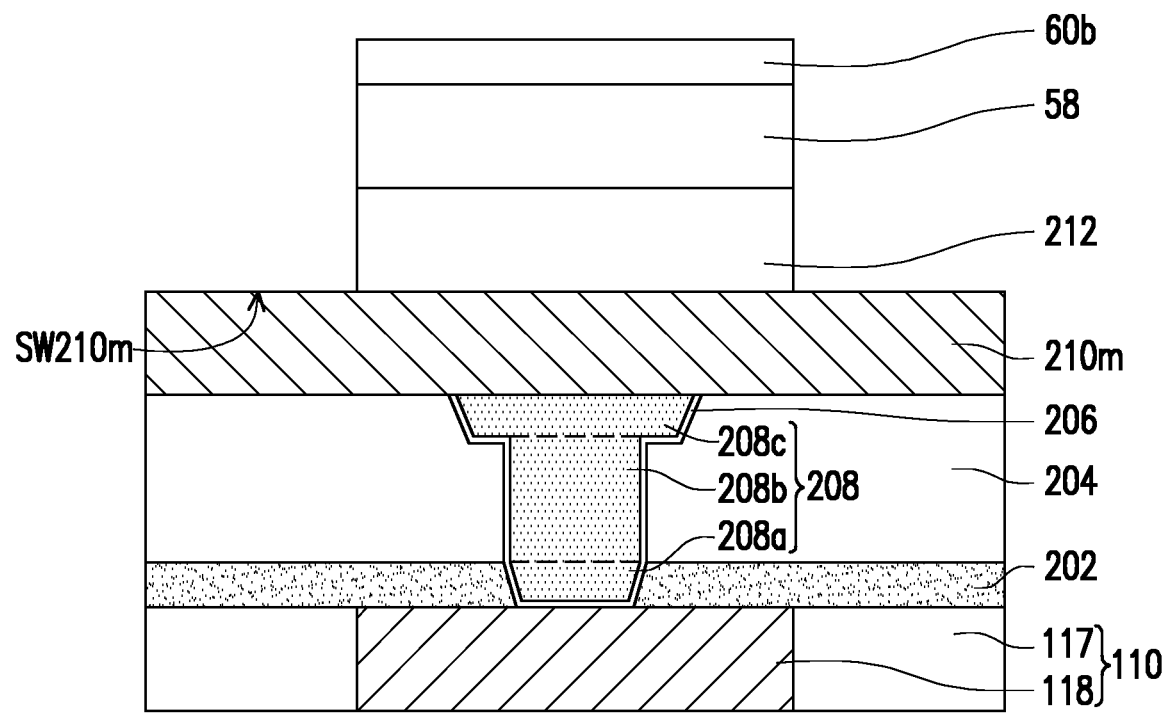
Figure 13:
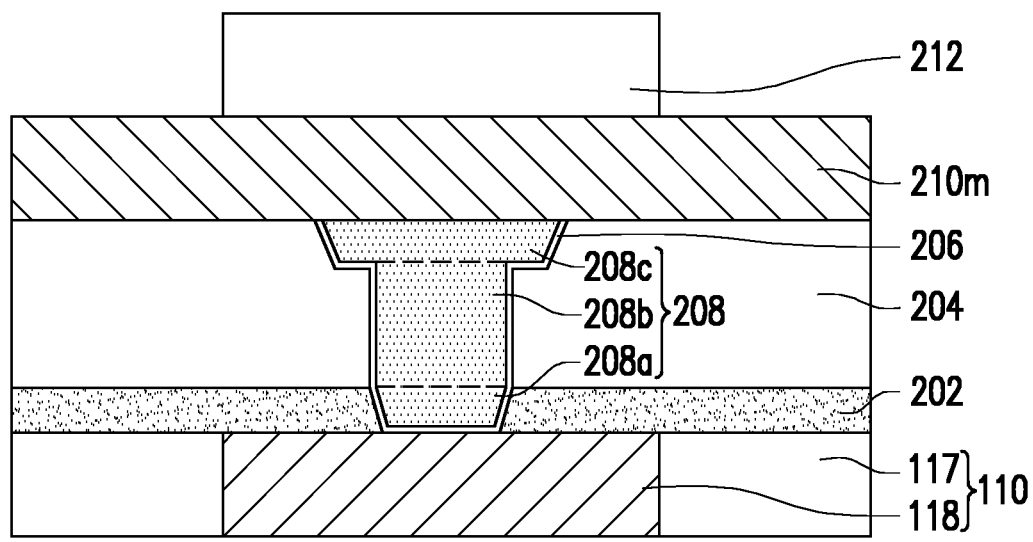

Referring to FIG. 11 to FIG. 13, the hard mask material 212m is patterned by using the photoresist pattern 60a and the BARC 58 as a mask. In the case, as shown in FIG. 12, a portion of the hard mask material 212m is removed, and the top electrode material 210m (e.g., a top surface S210t thereof) is exposed by a hard mask layer 212, the BARC 58 and a photoresist pattern 60b. The photoresist pattern 60a may be consumed during the patterning, thus the photoresist pattern 60b may have a thickness less than the thickness of the photoresist pattern 60a. After forming the hard mask layer 212, the photoresist pattern 60b and the BARC 58 are removed by any suitable method, such as $O_2$ ashing, as shown in FIG. 13.

Figure 14:
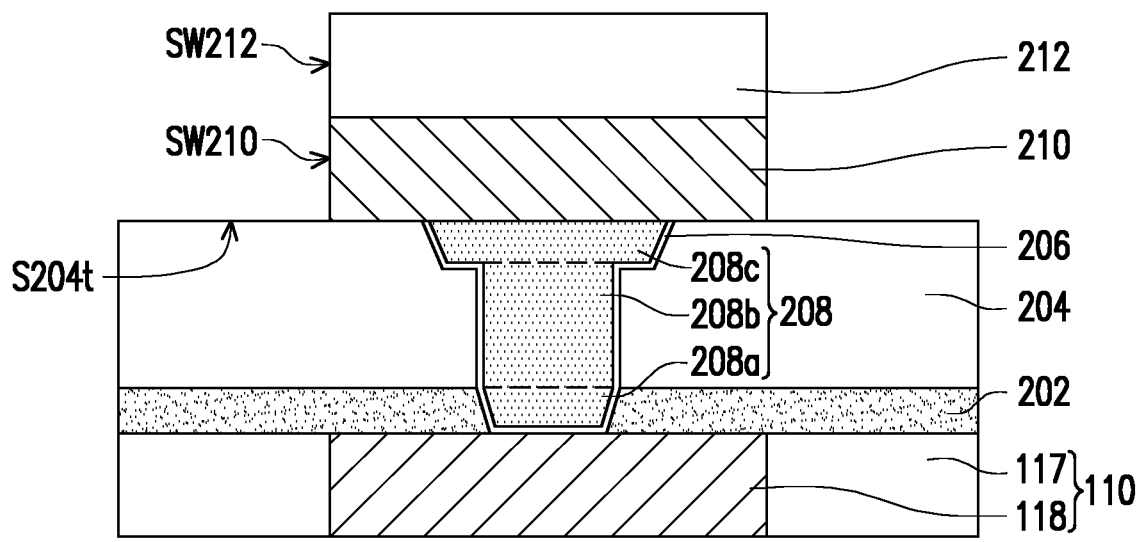

Referring to FIG. 13 and FIG. 14, the top electrode material 210m is patterned by using the hard mask layer 212 as a mask. In the case, as shown in FIG. 14, a portion of the top electrode material 210m is removed, and the second dielectric layer 204 (e.g., the top surface S204t) is exposed by a top electrode 210 and the hard mask layer 212 thereon. As shown in FIG. 14, sidewalls SW210 of the top electrode 210 and sidewalls SW212 of the hard mask layer 212 may be substantially aligned with each other within process variations. Owing to the configuration of the storage element layer 208 disposed in the recess R1, the heating dome of the storage element layer 208 proximately near the conductive layer 118 is distant from a location where the patterning process of the top electrode 210 occurring, thereby protecting the heating dome of the storage element layer 208 from the patterning induced damages.

Figure 15:
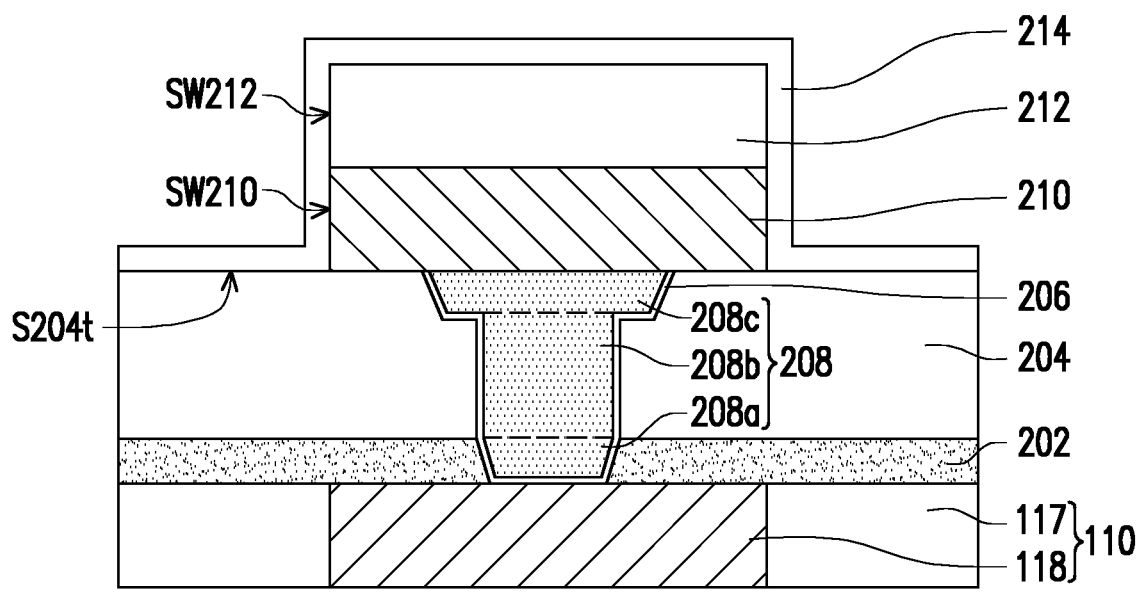

Referring to FIG. 15, in some embodiments, a protection layer 214 is formed over the structure depicted in FIG. 14. The protection layer 214 may be completely disposed on the hard mask layer 212 and the second dielectric layer 204 exposed by the hard mask layer 212 and the top electrode 210, and may further completely cover the sidewalls SW212 of the hard mask layer 212 and the sidewalls SW210 of the top electrode 210, as shown in FIG. 15. In some embodiments, the protection layer 214 extends continuously from an illustrated top surface of the hard mask layer 212 to the top surface S204t of the second dielectric layer 204. In the case, the protection layer 214 is continuously in contact with the sidewalls SW212 of the hard mask layer 212 and the sidewalls SW210 of the top electrode 210. That is, for example, the protection layer 214 laterally encloses each of the hard mask layer 212 and the top electrode 210. The protection layer 214, sometimes, may be referred to as an etching stop layer or contact etch stop layer (CESL) to prevent the top electrode 210 is damaged caused by over-etched during later sequential processes.

The protection layer 214 includes, for example, silicon nitride, silicon oxide, silicon oxynitride, silicon carbide, carbon-doped silicon nitride, carbon-doped silicon oxide, carbon-doped silicon oxynitride, or a combination thereof. In some embodiments, the protection layer 214 is deposited by using processes such as CVD (e.g., high density plasma (HDP) CVD or sub-atmospheric CVD (SACVD)), ALD, molecular layer deposition (MLD), or other suitable methods. The protection layer 214 functions as a protection layer that effectively blocks water or moisture from penetrating into the top electrode 210 and the storage element layer 208. The protection layer 214 may have a thickness of about 5 nm to about 10 nm, although other suitable thickness may alternatively be utilized.

Referring to FIG. 16, in some embodiments, an insulating layer 121 is formed on the protection layer 214 and covers the protection layer 214, the hard mask layer 212 and the top electrode 210. For example, the insulating layer 121 is referred to as an IMD layer which includes a dielectric material, such as silicon oxide, silicon nitride, silicon oxynitride, a spin-on dielectric material, or a low-k dielectric material. It should be noted that the low-k dielectric materials are generally dielectric materials having a dielectric constant lower than 3.9. The insulating layer 121 may be formed by any suitable method, such as CVD. The formation and material of the insulating layer 121 may be substantially identical or similar to the formation and material of the insulating layer 117 previously described in FIG. 1, and thus are not repeated herein for brevity.

Figure 24:
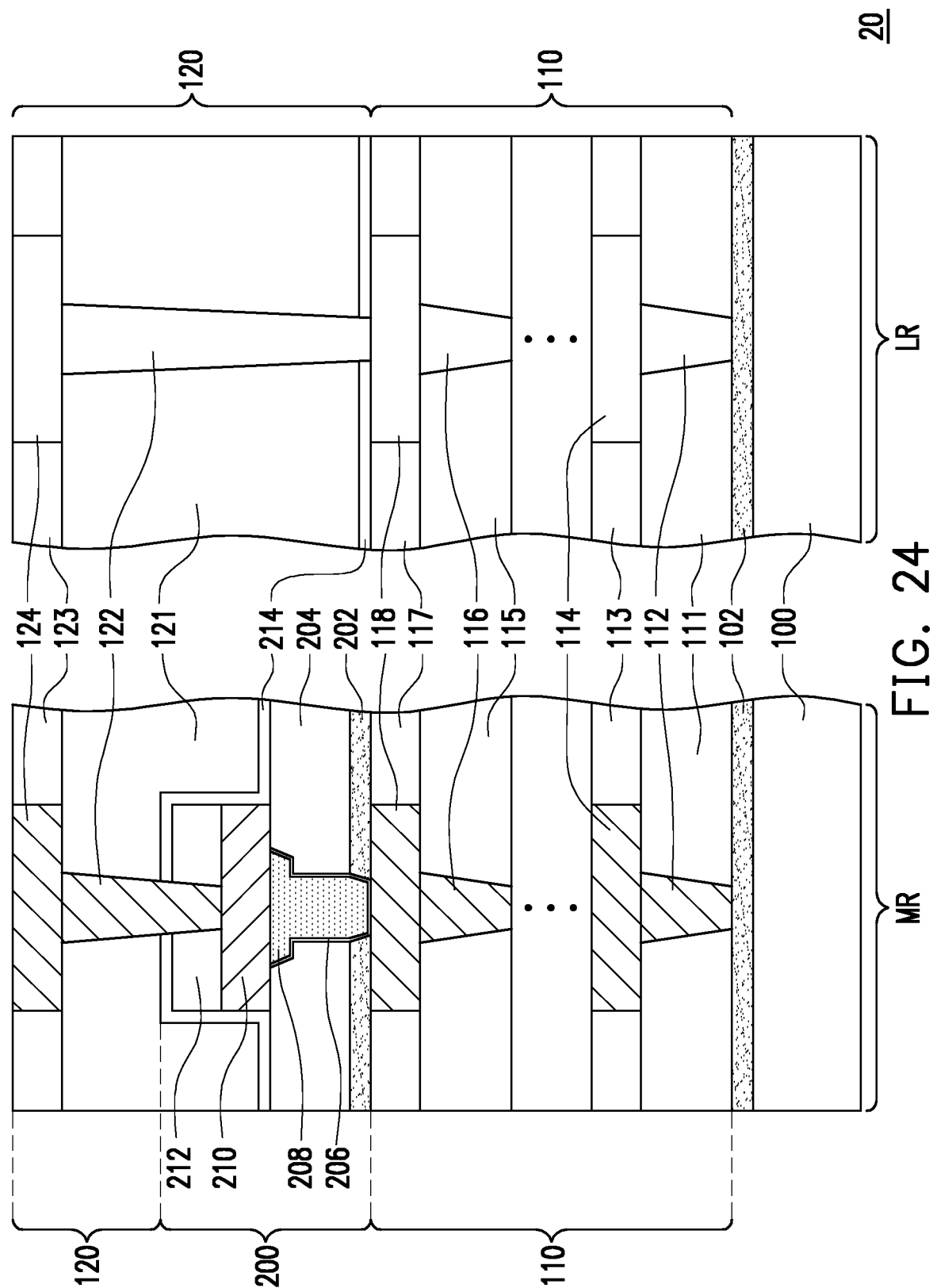
FIG. 24 is a schematic cross-sectional view of a semiconductor device in accordance with some alternative embodiments of the disclosure.

A conductive via 122 is then formed in the insulating layer 121 to electrically couple to the top electrode 210 by penetrating through the protection layer 214 and the hard mask layer 212, for example, as shown in FIG. 16. In some embodiments, the conductive via 122 is formed by a single damascene process including following steps. First, an opening (not labeled) is formed in the insulating layer 121. The opening penetrates though the insulating layer 121, the protection layer 214 and the hard mask layer 212 to reach the top electrode 210 by accessibly reveal at least a part of a top surface of the top electrode 210. Then, the opening is filled with a conductive material, where the conductive material is in physical contact with the exposed top surface of the top electrode 210. After that, a planarization process (e.g., a CMP process or etching back process) is performed to remove excessive conductive material over a plane including a top surface of the insulating layer 121, thereby forming the conductive via 122. In some embodiments, the conductive via 122 includes metals or metal alloys including one or more of Al, AlCu, Cu, Ti, TiN, W, or the like. One or more than one conductive via 122 may be formed, the disclosure is not limited to the drawing of FIG. 16. In some embodiments, a top surface of the conductive via 122 is substantially coplanar with the top surface of the insulating layer 121 within the process variations. The insulating layer 121 and the conductive via 122 may constitute a second interconnect structure 120 or a part thereof (as shown in FIG. 24).

As shown in FIG. 16, the semiconductor device 10 with the memory cell 200 is accomplished after forming the conductive via 122. Specifically, the memory cell 200 may include the storage element layer 208, the top electrodes 210 disposed on the storage element layer 208, and the protection layer 214 covering the top electrode 210 and its underlying layers. The memory cell 200 may further include the hard mask layer 212 disposed on the top electrode 210, where the protection layer 214 may further cover the hard mask layer 212. The hard mask layer 212 is sandwiched between the protection layer 214 and the top electrode 210, and the top electrode 210 is sandwiched between the storage element layer 208 and the hard mask layer 212, for example. The memory cell 200 may further include the barrier layer 206 underlying the storage element layer 208. As shown in FIG. 16, the barrier layer 206 may wrap sidewalls and a bottom surface of the storage element layer 208, where the storage element layer 208 may be sandwiched between the barrier layer 206 and the top electrode 210, and the barrier layer 206 may be sandwiched between the storage element layer 208 and the conductive layer 118 of the first interconnect structure 110. In an alternative embodiment of which the barrier layer 206 is omitted, the storage element layer 208 is sandwiched between (e.g., in physical contact with) the top electrode 210 and the conductive layer 118 of the first interconnect structure 110. In other words, the storage element layer 208 is self-heated which is directly induced by the current provided from the conductive layer 118 during operating the memory cell 200.

In some embodiments, the storage element layer 208 is a phase change material layer (hereinafter referred to as the PCM layer or PCM structure 208) when the memory cell 200 is a PCM cell, the PCM layer 208 has a variable phase representing a data bit. For example, the PCM layer 208 has a crystalline phase and an amorphous phase which are interchangeable. The crystalline phase and the amorphous phase may respectively represent a binary "1" and a binary "0", or vice versa. Accordingly, the PCM layer 208 has a variable resistance that changes with the variable phase of the PCM layer 208. For example, the PCM layer 208 has a high resistance in the amorphous phase and a low resistance in the crystalline phase. Sometimes, the PCM layer 208 may also be referred to as a variable resistance layer.

In the operation of the memory cell 200, the data state of the memory cell 200 is read by measuring the resistance of the memory cell 200 (i.e., the resistance from the bottom to the top of the PCM layer 208). The phase of the PCM layer 208 represents the data state of the memory cell 200, the resistance of the PCM layer 208, or the resistance of the memory cell 200. Further, the data state of the memory cell 200 may be set and reset by changing the phase of the PCM layer 208.

In some embodiments, the phase of the PCM layer 208 is changed by heating. For example, through an input current such as a set current "Iset" provided by the conductive layer 118, the PCM layer 208 is self-heated to a first temperature that induces crystallization of the PCM layer 208, so as to change the PCM layer 208 to the crystalline phase (e.g., to set the memory cell 200). Similarly, through an input current such as a reset current "Ireset" provided by the conductive layer 118, the PCM layer 208 is self-heated to a second temperature that melts the PCM layer 208, so as to change the PCM layer 208 to the amorphous phase (e.g., to reset the memory cell 200). The first temperature is lower than the second temperature. In some embodiments, the first temperature is 100° C. to 200° C. and the second temperature is 150° C. to 400° C.

The amount of heat generated by self-heating of the storage element layer 208 varies in proportion to the current applied thereto from the conductive layer 118. That is, the PCM layer 208 is heated up to a temperature (i.e., the second temperature) higher than the melting temperature when a current passes through it. The temperature is then quickly dropped below the crystallization temperature. In the case, a portion of the PCM layer 208 being self-heated is changed to the amorphous state with high resistivity, and thus the state of the memory cell 200 is changed to a high resistance state. Then, the portion of the PCM layer 208 may be back to the crystalline state by heating up the PCM layer 208 to a temperature (i.e., the first temperature) higher than the crystallization temperature and lower than the melting temperature, for a certain period.

Based on above, it is known that the PCM layer 208 is a key layer for operating the memory cell 200. In the present embodiment, the PCM layer 208 is formed by two-step etching process to include a first portion 208a, the second portion 208b and the third portion 208c, with the specific profile adopted from the recess R1. In the case, the first portion 208a of the PCM layer 208 is disposed over the conductive layer 118, and the critical dimension of a coupling area between the PCM layer 208 and the conductive layer 118 can be reduced by decreasing the width W4 of the first portion 208a of the PCM layer 208. Due to the small critical dimension of the first portion 208a, the self-heating of the PCM layer 208 directly induced by the current(s) provided from the conductive layer 118 is promoted and the heating of the PCM layer 208 is centralized. Therefore, the reset current (Ireset) is reduced. For example, the reset current (Ireset) of the memory cell 200 is lowered than that of a conventional memory cell having a bottom electrode therein. Moreover, since the small input current is utilized for the memory cell 200, a device density of the memory cell 200 in the semiconductor device 10 can be increased in a given area without violating the design requirement/constrain (e.g., relevant to the voltage or current overloading issue), thereby improving the performance of the semiconductor device 10 having the memory cell 200 as compared to a semiconductor device having the conventional memory cell. On the other hand, due to the double trench profile of the recess R1, a gap-fill process window for the PCM layer 208 is increased, which improves the uniformity of layer deposition so to prevent the void/seam/hole event inside the recess R1 during forming the PCM layer 208. In addition, there is no bottom electrode in the memory cell 200, and thus an oxidation at the conventional bottom electrode is avoid; and due to the two-step etching process, an oxidation at the conductive layer 118 can also avoid.

Figure 17:
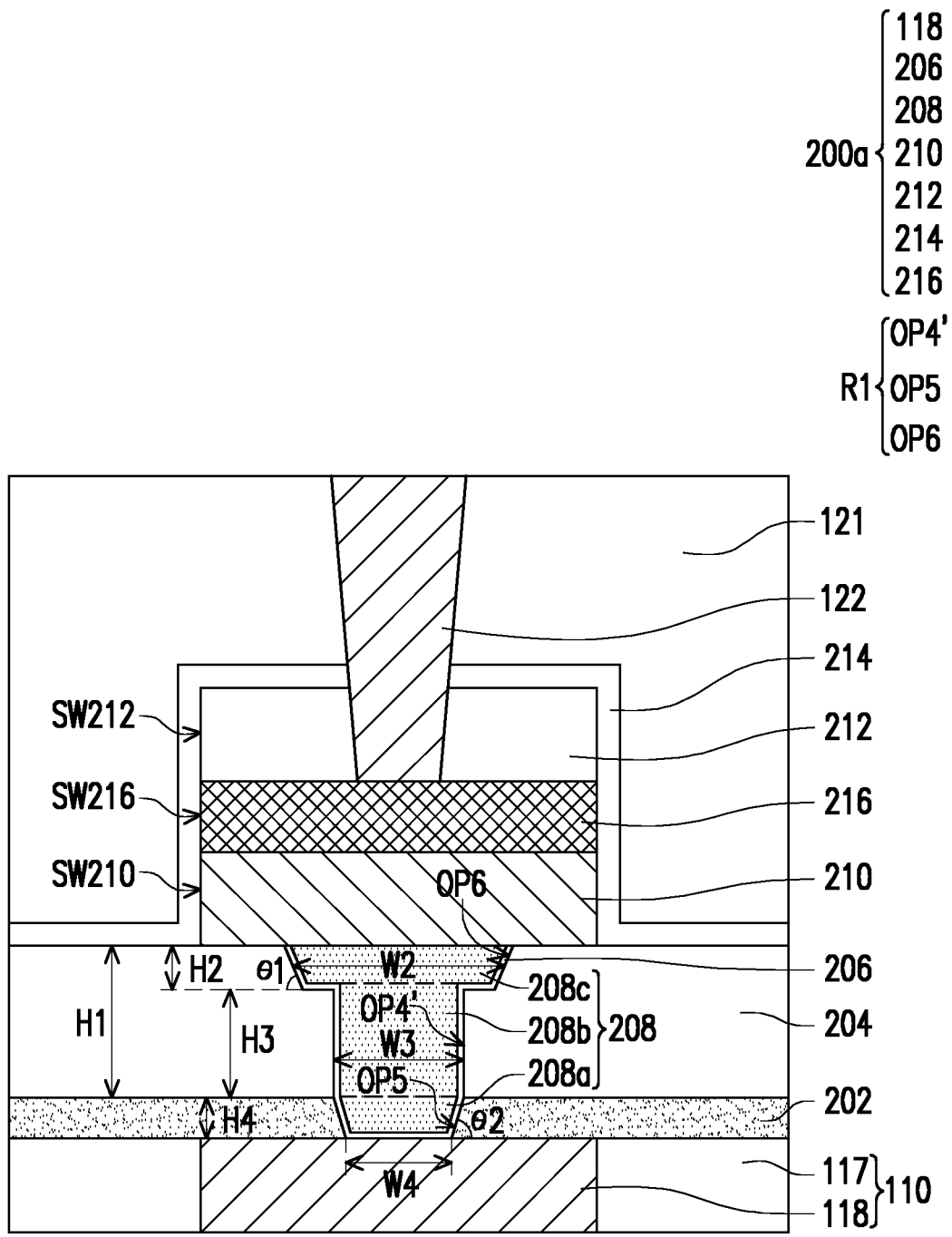
FIG. 17 through FIG. 19 are respectively schematic sectional views of a memory cell in accordance with some other embodiments of the disclosure.
Figure 18:
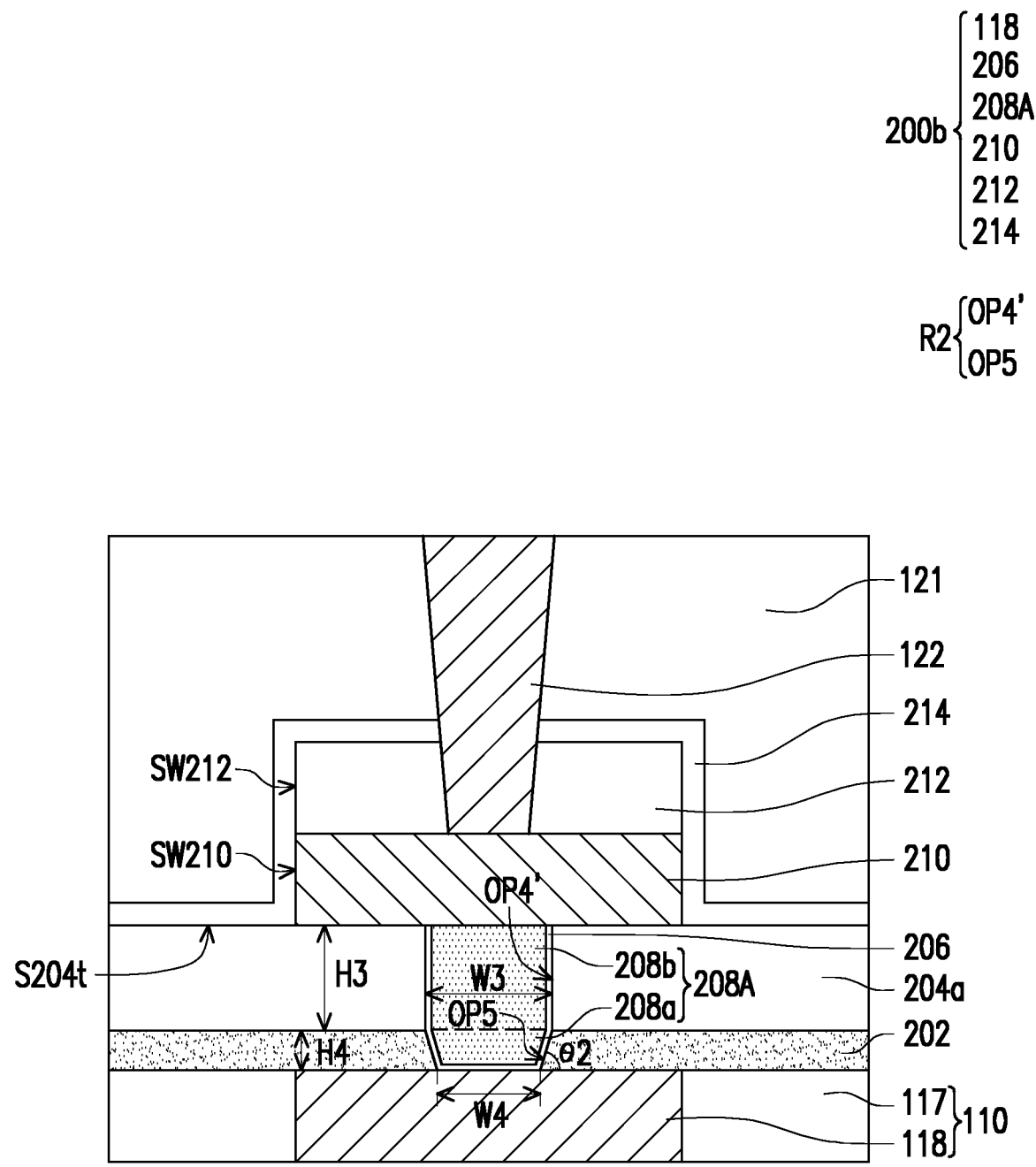
Figure 19:
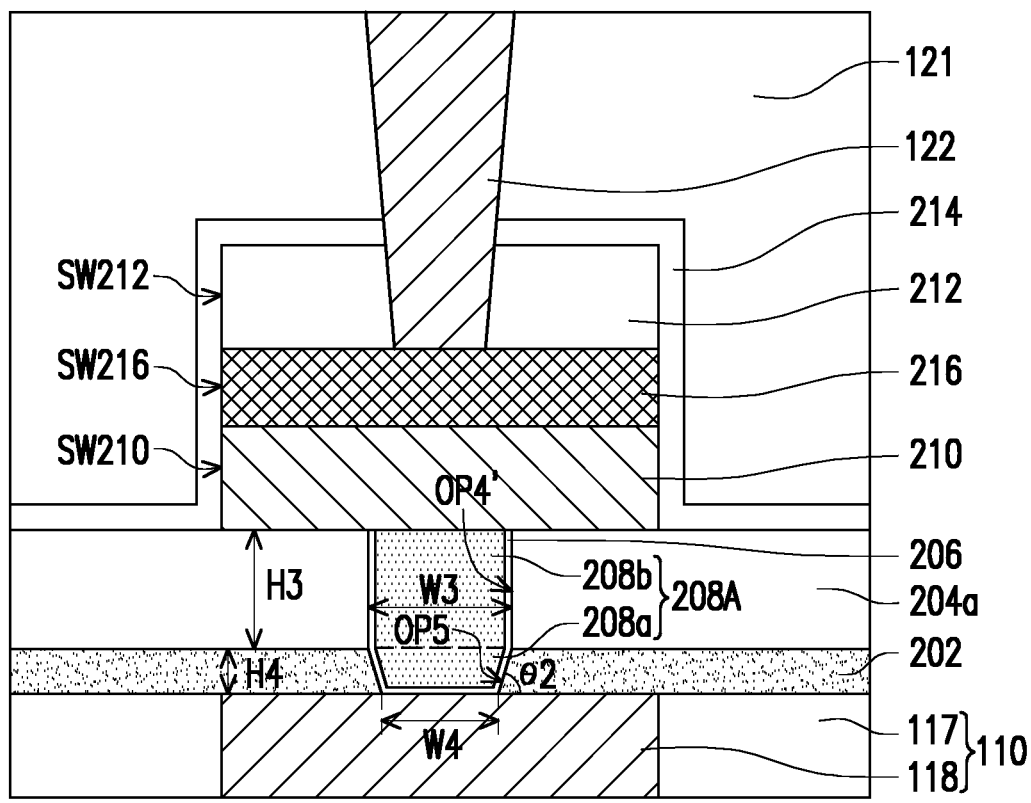

Although only one memory cell 200 is shown in the semiconductor device 10 of FIG. 16 for illustrative purpose, the disclosure is not limited thereto. The number of the memory cell may be one or more than one depending on the design requirement and demand. FIG. 17 through FIG. 19 are respectively schematic sectional views of a memory cell in accordance with some other embodiments of the disclosure. In some embodiments, the memory cell 200 included in the semiconductor device 10 may be substituted by any one of memory cells 200a, 200b and 200c respectively depicted in FIG. 17 to FIG. 19.

Referring to FIG. 17, in some embodiments, the memory cell 200a is similar to the memory cell 200 of FIG. 16; that is, the structures, materials, and functions of the memory cell 200a are similar to those of the memory cell 200, and thus the details are omitted herein. The main difference between the memory cell 200a and the memory cell 200 lies in that the memory cell 200a further includes a selector 216 interposed between the hard mask layer 212 and the top electrode 210. As shown in FIG. 17, sidewalls SW216 of the selector 216 are substantially aligned with the sidewalls SW212 of the hard mask layer 212 and the sidewalls SW210 of the top electrode 210 within the process variations. For example, the protection layer 214 may cover the sidewalls SW216 of the selector 216. In some embodiments, the selector 216 includes an ovonic threshold switch (OTS) material while the top electrode 210 includes W or WN. The OTS material may include a chalcogenide material that is responsive to an applied voltage across the selector 216. For an applied voltage that is less than a threshold voltage, the selector 216 remains in an "off" state, e.g., an electrically nonconductive state. Alternatively, responsive to an applied voltage across the selector 216 that is greater than the threshold voltage, the selector 216 enters an "on" state, e.g., an electrically conductive state. That is, the selector 216 is referred to as a switch for determining to turn on or turn off the memory cell 200a, sometimes.

Referring to FIG. 18, in some embodiments, the memory cell 200b is similar to the memory cell 200 of FIG. 16; that is, the structures, materials, and functions of the memory cell 200b are similar to those of the memory cell 200, and thus the details are omitted herein. The main difference between the memory cell 200b and the memory cell 200 lies in that the memory cell 200b includes a storage element layer (may referred to as a storage element structure) 208A (hereinafter referred to as the PCM layer or structure 208A) substituting the storage element (or PCM) layer 208. As shown in FIG. 18, the PCM layer 208A may include a first portion 208a and a second portion 208b disposed thereon, only. The details of the first and second portions 208a and 208b have been previously discussed in FIG. 9, and thus are not repeated herein for simplicity. In some embodiments, the first portion 208a and the second portion 208b are together referred to as a via portion of the storage element layer 208A. For example, the first portion 208a of the PCM layer 208A is disposed between the conductive layer 118 and the top electrode 210, and the second portion 208b of the PCM layer 208A is disposed between the first portion 208a and the top electrode 210. As shown in FIG. 18, the top electrode 210 may be sandwiched between (e.g., in physical contact with) the hard mask layer 212 and the first portion 208b of the PCM layer 208A.

The memory cell 200b may be formed by, but not limited to, performing a planarization step (e.g., a CMP process) on the second dielectric layer 204 to remove the third portion 208c and to form a second dielectric layer 204a exposing the second portion 208b, following the process as described in FIG. 9. For example, after the planarization step, the PCM layer 208A including the first portion 208a and the second portion 208b is formed, where the first portion 208a is disposed in the opening OP2 formed in the first dielectric layer 202 and the second portion 208b is disposed in the opening OP4' formed in the second dielectric layer 204a. In other words, the PCM layer 208A is disposed in a recess R2 constituted by the opening OP4' and the opening OP5. As shown in FIG. 18, a top surface of the PCM layer 208A and a top surface of the barrier layer 206 may be substantially coplanar to and leveled with a top surface S204t of the second dielectric layer 204a within process variations. In some embodiments, the top surface of the PCM layer 208A and the top surface of the barrier layer 206 is accessibly revealed by the top surface S204t of the second dielectric layer 204a. Thereafter, the processes of FIG. 10 through FIG. 16 are performed on the PCM layer 208A to form the memory cell 200b. Due to the thickness (e.g., H3+H4) of the PCM layer 208A is less than the thickness (e.g., H2+H3+H4) of the PCM layer 208, an overall thickness of the memory cell 200b can be decreased.

Referring to FIG. 19, in some embodiments, the memory cell 200c is similar to the memory cell 200b of FIG. 18; that is, the structures, materials, and functions of the memory cell 200c are similar to those of the memory cell 200b, and thus the details are omitted herein. The main difference between the memory cell 200c and the memory cell 200b lies in that the memory cell 200c further includes a selector 216 interposed between the hard mask layer 212 and the top electrode 210. The details (e.g., the formation, material, thickness, configuration or the like) of the selector 216 have been described in FIG. 17, and thus are not repeated herein.

Figure 20:
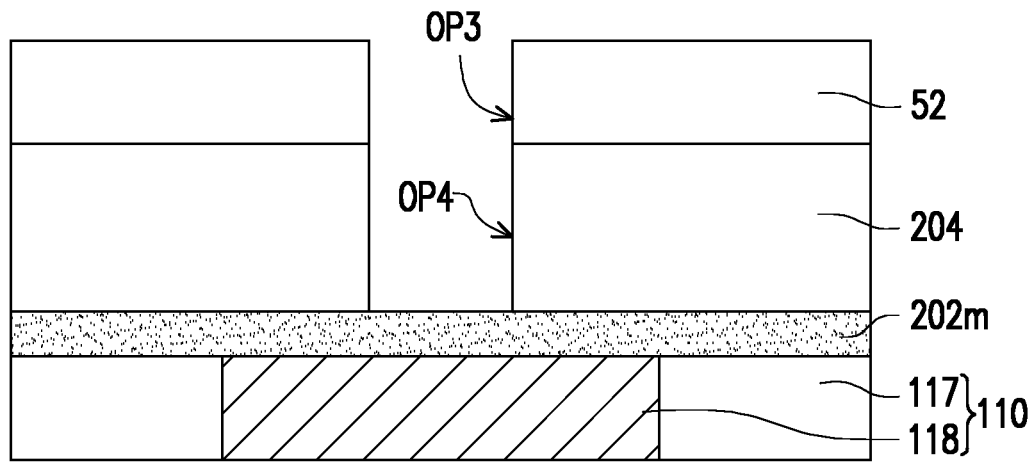
FIG. 20 through FIG. 22 are schematic cross-sectional views showing a method of manufacturing a memory cell in accordance with some alternative embodiments of the disclosure.
Figure 21:
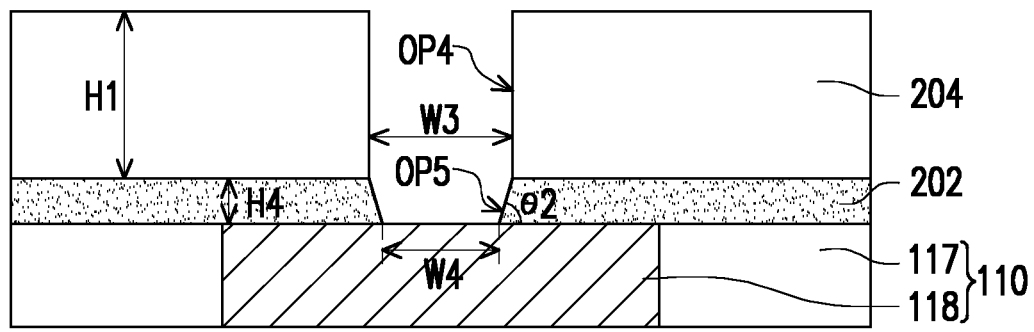
Figure 22:
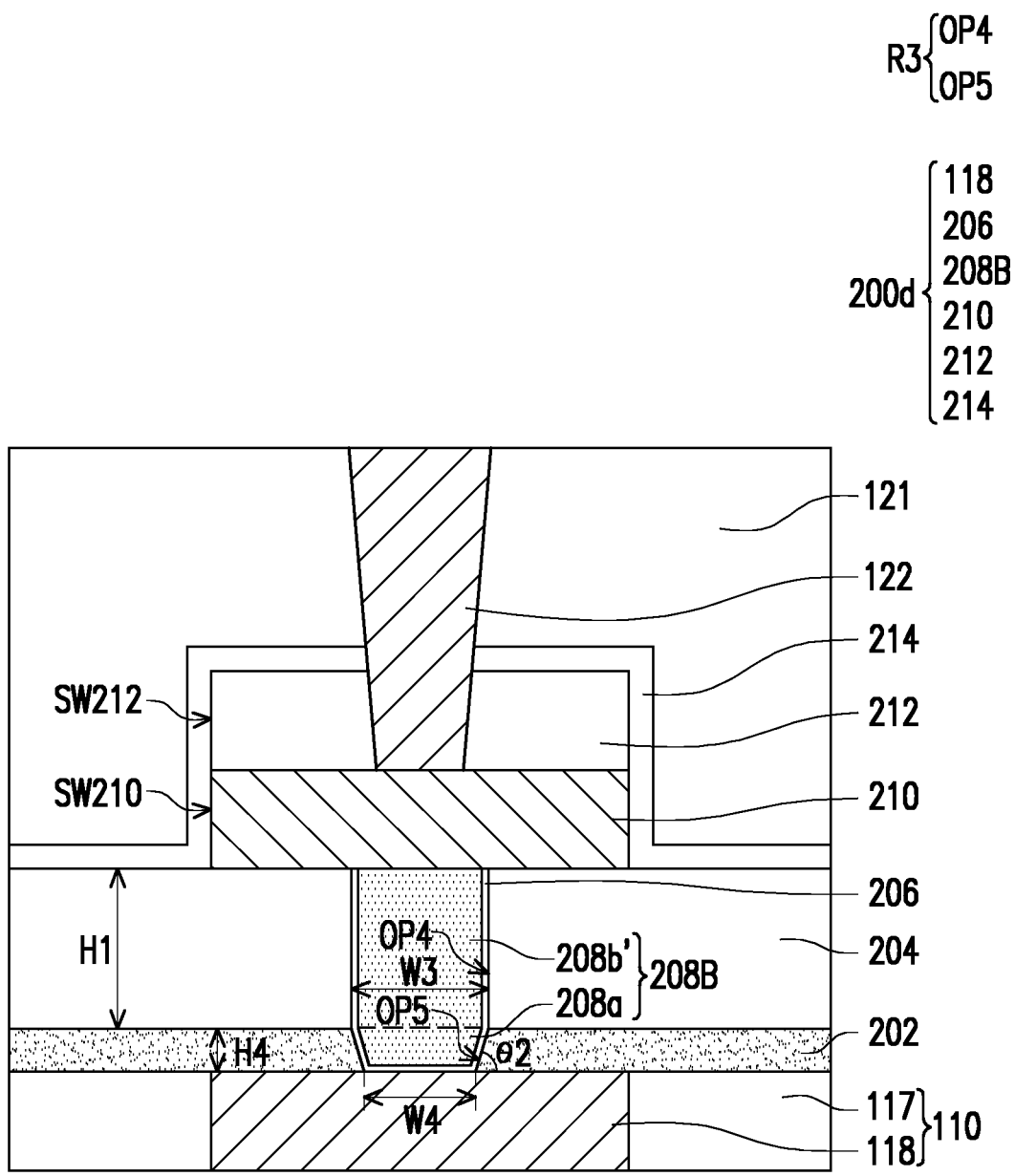

FIG. 20 through FIG. 22 are schematic cross-sectional views showing a method of manufacturing a memory cell 200d in accordance with some alternative embodiments of the disclosure. The elements similar to or substantially the same as the elements described previously will use the similar or same reference numbers, and certain details or descriptions (e.g., formation methods, materials, and so on) of the same elements may not be repeated herein.

Referring to FIG. 20, in some embodiments, the hard mask layer 54 is removed from the ARD layer 52, following the process as described in FIG. 4. The hard mask layer 54 may be removed by etching (such as a dry etching, a wet etching or a combination thereof). However, any other suitable processes may alternatively be utilized. As shown in FIG. 20, the opening OP4 may penetrate through the second dielectric layer 204, and the first dielectric material 202m may be exposed by the opening OP4.

Referring to FIG. 20 and FIG. 21, in some embodiments, the first dielectric material 202m is patterned by using the ARD layer 52 as a mask. The details of the patterning have previously described in FIG. 6, and thus are not repeated herein. In the case, a portion of the first dielectric material 202m is removed to form a first dielectric layer 202 having an opening OP5. For example, the conductive layer 118 is exposed by the opening OP5 formed in the first dielectric layer 202 and the opening OP4 formed in the second dielectric layer 204. The opening OP5 has an opening size (in a horizontal direction) gradually increasing in a direction from an illustrated bottom surface of the first dielectric layer 202 towards an illustrated top surface of the first dielectric layer 202, in some embodiments. As shown in FIG. 21, sidewalls of the opening OP5 formed in the first dielectric layer 202 may be slant sidewalls. Alternatively, the sidewalls of the opening OP5 formed in the first dielectric layer 202 may be curved sidewalls. As shown in FIG. 21, the opening OP5 may be directly below and spatially communicated with the opening OP4. The opening OP5 penetrates through the first dielectric layer 202, in some embodiments.

In some embodiments, the openings OP4 and OP5 together constitute a recess R3 formed in and penetrating through a dielectric structure including the first dielectric layer 202 and the second dielectric layer 204 stacked thereon. As shown in FIG. 21, the conductive layer 118 may be exposed by the recess R3. In addition, the openings OP4 and OP5 includes in the recess R3 independently may have a round, elliptical, square, rectangular or polygonal profile in a top view. After the formation of the first dielectric layer 202, the ARD layer 52 is removed. The ARD layer 52 may be removed by etching (such as a dry etching, a wet etching or a combination thereof) and/or ashing. However, any other suitable processes may alternatively be utilized.

The opening OP4 may be referred to as an upper portion of the recess R3. The opening OP4 may have a lateral size W3 approximately ranging from 30 nm to 40 nm and a height H1 approximately ranging from 30 nm to 90 nm, such as from about 30 nm to about 80 nm, as shown in FIG. 21. In one embodiment, the height H1 approximately ranges from 30 nm to 50 nm. In an alternative embodiment, the height H1 approximately ranges from 50 nm to 90 nm, such as from about 50 nm to about 80 nm. The lateral size W3 may be referred to as a width W3. The height H1 of the opening OP4 is the height of the second dielectric layer 204, for example. In some embodiments, the width W3 is substantially constant along the direction from the illustrate bottom surface of the second dielectric layer 204 towards the illustrated top surface of the second dielectric layer 204. In some embodiments, sidewalls of the opening OP4 are vertical sidewalls.

The opening OP5 may be referred to as a lower portion of the recess R3, which may be directly disposed below the opening OP4. The opening OP5 has a bottom opening at the conductive layer 118 and a top opening at the opening OP4, where the top opening of the opening OP5 has a width (not label) substantially equal to the width W3 of the opening OP4 and greater than a width of the bottom opening of the opening OP5, for example. As shown in FIG. 21, the bottom opening of the opening OP5 may have a lateral size W4 approximately ranging from 10 nm to 20 nm and a height H4 approximately ranging from 5 nm to 20 nm. The lateral size W4 may be referred to as a width W4. The height H4 of the opening OP5 is the height of the first dielectric layer 202, for example. In some embodiments, an angle θ2 between the illustrate bottom surface of the first dielectric layer 202 and the sidewall of the opening OP5 is approximately ranging from 45° to 60°.

Referring to FIG. 22, in some embodiments, after the formation of the recess R3, the processes of FIG. 8 through FIG. 16 are performed to form a barrier layer 206, a storage element layer (may referred to as a storage element structure) 208B (hereinafter referred to as the PCM layer or structure 208B), a top electrode 210, a hard mask layer 212, a protection layer 214, an insulating layer 121, and a conductive via 122. The details of the barrier layer 206, the top electrode 210, the hard mask layer 212, the protection layer 214, the insulating layer 121 and the conductive via 122 have been previously described in FIG. 8 through FIG. 16, the formation and material of the PCM layer 208B is similar to the formation and material of the PCM layer 208 previous described in FIG. 8 and FIG. 9, and thus are not repeated herein for simplicity. In some embodiments, the first portion 208a and the second portion 208b' are together referred to as a via portion of the storage element layer 208B.

In some embodiments, as shown in FIG. 22, the memory cell 200d is accomplished after forming the conductive via 122. Specifically, the memory cell 200d may include the PCM layer 208B, the top electrodes 210 disposed on the PCM layer 208B, and the protection layer 214 covering the top electrode 210 and its underlying layers. The memory cell 200d may further include the hard mask layer 212 disposed on the top electrode 210, where the protection layer 214 may further cover the hard mask layer 212. The hard mask layer 212 is sandwiched between the protection layer 214 and the top electrode 210, and the top electrode 210 is sandwiched between the PCM layer 208B and the hard mask layer 212, for example. The memory cell 200d may further include the barrier layer 206 underlying the PCM layer 208B. As shown in FIG. 22, the barrier layer 206 may wrap sidewalls and a bottom surface of the PCM layer 208B, where the PCM layer 208B may be sandwiched between the barrier layer 206 and the top electrode 210, and the barrier layer 206 may be sandwiched between the PCM layer 208B and the conductive layer 118 of the first interconnect structure 110. In other words, the PCM layer 208B is self-heated which is directly induced by the current provided from the conductive layer 118 during operating the memory cell 200d.

The barrier 206 may be a conformal liner of the recess R3. As shown in FIG. 22, the barrier layer may be TaN formed by ALD, although any other suitable materials and processes may alternatively be utilized. In some embodiments, the PCM layer 208B is formed in the recess R3 to include a first portion 208a and a second portion 208b' stacked thereon, where the first portion 208a is disposed in the opening OP5 formed in the first dielectric layer 202 and the second portion 208b' is disposed in the opening OP4 formed in the second dielectric layer 204. That is, for example, the PCM layer 208B is formed to adopt the specific profile of the recess R3 as previously described in FIG. 22. The details of the specific profile of the PCM layer 208B are not repeated herein for brevity. As shown in FIG. 22, the PCM layer 280B may be Si-doped or Ge-doped GST formed by ALD, although any other suitable materials and processes may alternatively be utilized. Due to the small critical dimension of the first portion 208a, the self-heating of the PCM layer 208B directly induced by the current(s) provided from the conductive layer 118 is promoted and the heating of the PCM layer 208B is centralized. Therefore, the reset current (Ireset) is reduced. Moreover, since the small input current is utilized for the memory cell 200d, a device density of the memory cell 200d in a semiconductor device can be increased in a given area without violating the design requirement/constrain (e.g., relevant to the voltage or current overloading issue), thereby improving the performance of the semiconductor device. In addition, there is no bottom electrode in the memory cell 200d, and thus an oxidation at the conventional bottom electrode is avoid; and due to the two-step etching process, an oxidation at the conductive layer 118 can also avoid. In an alternative embodiment of which the barrier layer 206 is omitted, the PCM layer 208B is sandwiched between (e.g., in physical contact with) the top electrode 210 and the conductive layer 118 of the first interconnect structure 110.

Figure 23:
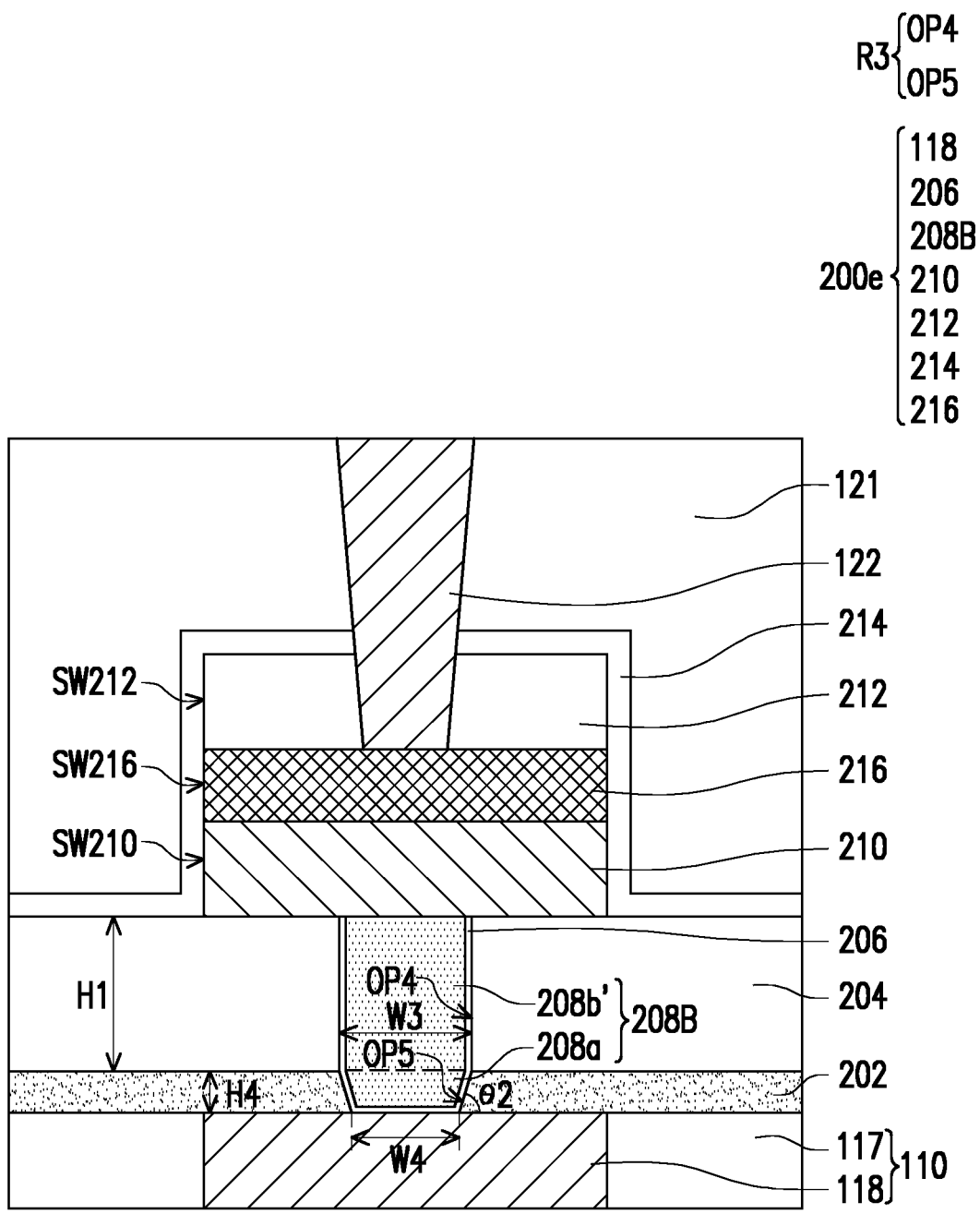
FIG. 23 is a schematic sectional view of a memory cell in accordance with some other alternative embodiments of the disclosure.

Referring to FIG. 23, in some embodiments, the memory cell 200e is similar to the memory cell 200d of FIG. 22; that is, the structures, materials, and functions of the memory cell 200e are similar to those of the memory cell 200d, and thus the details are omitted herein. The main difference between the memory cell 200e and the memory cell 200d lies in that the memory cell 200e further includes a selector 216 interposed between the hard mask layer 212 and the top electrode 210. The details (e.g., the formation, material, thickness, configuration or the like) of the selector 216 have been described in FIG. 17, and thus are not repeated herein.

In the above embodiments, dielectric spacers (not shown) may be further included at the sidewalls SW210 of the top electrode 210 and the sidewalls SW212 of the hard mask layer 212, as alternatives. For example, the dielectric spacers continuously extend along the sidewalls SW210 of the top electrode 210 and the sidewalls SW212 of the hard mask layer 212. The lateral size (e.g., a width) of the dielectric spacers may be gradually decreased in a direction from the top electrode 210 towards the hard mask layer 212. In some embodiments, the dielectric spacers are formed by depositing a spacer layer (not shown) over and around the hard mask layer 212 and the top electrode 210 before the formation of the protection layer 214. For example, the spacer layer is deposited by a deposition technique (e.g., PVD, CVD, PECVD (plasma-enhanced chemical vapor deposition), ALD, sputtering, etc.) to a desired thickness. Thereafter, the spacer layer is etched to remove the spacer layer from horizontal surfaces, leaving the dielectric spacers along opposing sides of the top electrode 210 and the hard mask layer 212. In various embodiments, the dielectric spacers may comprise a nitride (e.g., silicon nitride or silicon oxy-nitride), an oxide (e.g., silicon dioxide), or the like. In the alternative embodiments of which the selector 216 is included, the dielectric spacers further continuously extend along the sidewalls SW210 of the top electrode 210, the sidewalls SW212 of the hard mask layer 212, and the sidewalls SW216 of the selector 216. In some embodiments, the dielectric spacers can provide further physical protection to the memory cell (e.g., 200, 200a, 200b, 200c, 200d, or 200e), such as effectively blocks water or moisture from penetrating into the storage element layer (e.g., 208, 208A or 208B).

Besides, the reset current may be further lowered by adjusting the electrical resistivity and thermal conductivity of the storage element layer (e.g., 208, 208A or 208B) in the above embodiments. In one embodiment, the reset current may be further lowered by increasing the electrical resistivity of the storage element layer (e.g., 208, 208A or 208B). In an alternative embodiment, the reset current may be further lowered by decreasing the thermal conductivity of the storage element layer (e.g., 208, 208A or 208B). In a further alternative embodiment, the reset current may be further lowered by simultaneously increasing the electrical resistivity of the storage element layer (e.g., 208, 208A or 208B) and decreasing the thermal conductivity of the storage element layer (e.g., 208, 208A or 208B).

FIG. 24 is a schematic cross-sectional view of a semiconductor device in accordance with some alternative embodiments of the disclosure. The memory cell 200 illustrated in the following embodiments is applied to a PCM cell. The structures, materials, and processes may be similar to what are shown in, and discussed referring to, FIG. 1 through FIG. 16. The details are thus not repeated herein. It is noted that other memory cells 200a-200e may individually substitute the memory cell 200 to form the semiconductor device of the example.

Referring to FIG. 24, a semiconductor device 20 may include memory region MR and a logic region LR. In some embodiments, the memory region MR includes a substrate 100, a device region 102, a first interconnect structure 110, the memory cell 200, and a second interconnect structure 120. In certain embodiments, the logic region LR includes the substrate 100, the device region 102, the first interconnect structure 110, and the second interconnect structure 120.

In some embodiments, the substrate 100 is a semiconductor substrate, such as a bulk semiconductor, a semiconductor-on-insulator (SOI) substrate, or the like. The substrate 100 may be doped (e.g., with a p-type or an n-type dopant) or undoped. The substrate 100 may be a wafer, such as a silicon wafer. Generally, the SOI substrate is a layer of a semiconductor material formed on an insulator layer. The insulator layer is, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the substrate 100 includes an element semiconductor such as silicon or germanium, a compound semiconductor such as silicon carbide, gallium arsenic, gallium phosphide, indium phosphide, indium arsenide and indium antimonide, an alloy semiconductor such as SiGe, GaAsP, AlInAs, AlGaAs, GaInAs, GaInP and GaInAsP or combinations thereof.

In some embodiments, the device region 102 is disposed on the substrate 100 in a front-end-of-line (FEOL) process. The device region 102 may include a wide variety of devices. In some alternative embodiments, the devices include active components, passive components, or a combination thereof. In some other embodiments, the devices include integrated circuits devices. The devices are, for example, transistors, capacitors, resistors, diodes, photodiodes, fuse devices, or other similar devices. In an embodiment, the device region 102 includes a gate structure, source and drain regions, and isolation structures such as shallow trench isolation (STI) structures (not shown). In the device region 102, various N-type metal-oxide semiconductor (NMOS) and/or P-type metal-oxide semiconductor (PMOS) devices, such as transistors or memories and the like, may be formed and interconnected to perform one or more functions. Other devices, such as capacitors, resistors, diodes, photodiodes, fuses and the like may also be formed over the substrate 100. The functions of the devices may include memory, processors, sensors, amplifiers, power distribution, input/output circuitry, or the like.

As illustrated in FIG. 24, the first interconnect structure 110 in the memory region MR is disposed on the device region 102, and the device region 102 is disposed between the substrate 100 and the first interconnect structure 110. In some embodiments, the first interconnect structure 110 includes a plurality of build-up layers (M1 to Mx−1, where x is a positive integer of 3 or greater; not labeled) formed with insulating layers and conductive layers. In detail, the first interconnect structure 110 at least includes insulating layers 111, 113, 115, 117, conductive vias 112, 116, and conductive layers 114, 118. The conductive via 112 is disposed on and electrically connected to the device region 102. The conductive layer 114 is disposed on and electrically connected to the conductive via 112. The insulating layers 111, 113 are collectively referred to as an IMD layer laterally covering the conductive via 112 and the conductive layer 114 to constitute a build-up layer M1. On the other hand, the conductive layer 118 is disposed on and electrically connected to the conductive via 116. The insulating layers 115, 117 are collectively referred to as an IMD layer laterally covering the conductive via 116 and the conductive layer 118 to constitute another build-up layer Mx−1. As shown in FIG. 24, the build-up layer M1 (111, 112, 113, 114) is electrically connected to the build-up layer Mx−1 (115, 116, 117, 118) through other build-up layer(s) (not shown) therebetween, for example. Alternatively, the build-up layer M1 (111, 112, 113, 114) may be electrically connected to the build-up layer Mx−1 (115, 116, 117, 118), directly.

In a similar way, the first interconnect structure 110 in the logic region LR is disposed on the device region 102, and the device region 102 is disposed between the substrate 100 and the first interconnect structure 110. In some embodiments, the first interconnect structure 110 is electrically connected to the logic devices in the device region 102. In some embodiments, the first interconnect structure 110 in the logic region LR includes a plurality of build-up layers (M1' to Mn−1, where n is a positive integer of 3 or greater; not labeled) formed with insulating layers and conductive layers. In detail, the first interconnect structure 110 in the logic region LR at least includes insulating layers 111, 113, 115, 117, conductive vias 112, 116, and conductive layers 114, 118. The conductive via 112 is disposed on and electrically connected to the device region 102. The conductive layer 114 is disposed on and electrically connected to the conductive via 112. The insulating layers 111, 113 are laterally covering the conductive via 112 and the conductive layer 114 to constitute a build-up layer M1'. On the other hand, the conductive layer 118 is disposed on and electrically connected to the conductive via 116. The insulating layers 115, 117 are laterally covering the conductive via 116 and the conductive layer 118 to constitute another build-up layer Mn−1. As shown in FIG. 24, the build-up layer M1' (111, 112, 113, 114) is electrically connected to the build-up layer Mn−1 (115, 116, 117, 118) through other build-up layer(s) (not shown) therebetween, for example. Alternatively, the build-up layer M1' (111, 112, 113, 114) may be electrically connected to the build-up layer Mn−1 (115, 116, 117, 118), directly.

As further illustrated in FIG. 24, the memory cell 200 and the second interconnect structure 120 are stacked on the first interconnect structure 110 in order in the memory region MR. The memory cell 200 is electrically connected the first interconnect structure 110 and the second interconnect structure 120. The second interconnect structure 120 in the memory region MR may include insulating layers 121, 123, a conductive via 122, and a conductive layer 124. The insulating layer 121 is disposed on the memory cell 200 to cover the memory cell 200. The conductive via 122 is disposed in the insulating layer 121 to electrically connect to the top electrode 210. The insulating layer 123 is disposed on the insulating layer 121. The conductive layer 124 is disposed in the insulating layer 123. The conductive layer 124 is in contact with and electrically connected to the conductive via 122. In some embodiments, the insulating layers 121 and 123 are collectively referred to as an IMD layer. The conductive layer 124 and the conductive via 122 are a portion of a current driving circuit (not shown) to provide current to the memory cell 200. In some embodiments, the conductive via 122 and the conductive layer 124 are formed by a dual damascene process. That is, the conductive via 122 and the conductive layer 124 may be formed simultaneously. The insulating layers 121, 123 are laterally covering the conductive via 122 and the conductive layer 124 to constitute a build-up layer (Mx; not labeled) or a part of a build-up layer.

Furthermore, the PCM layer 208 of the memory cell 200 is electrically connected to the conductive layer 118 of the first interconnect structure 110, and the top electrode 210 of the memory cell 200 is electrically connected to the conductive via 122 of the second interconnect structure 120. In some embodiments, the conductive layer 118 and the conductive via 122 may provide the voltages to the memory cell 200 for operating the memory functions thereof. In other embodiments, one or more of the memory cells 200a-200e are used to replace the memory cell 200.

On the other hand, in some embodiments, the second interconnect structure 120 in the logic region LR is disposed on the first interconnect structure 110, and the interconnect structure 110 is disposed between the device region 102 and the second interconnect structure 120. In some embodiments, the interconnect structure 120 is electrically connected to the first interconnect structure 110. In some embodiments, the second interconnect structure 120 in the logic region LR includes the insulating layers 121, 123, the conductive via 122, and the conductive layer 124. The insulating layer 121 is disposed on the protection layer 214 extending from the memory region MR to the logic region LR. The conductive via 122 is disposed in the insulating layer 121 and the protection layer 214 to electrically connect to the conductive layer 118. The insulating layer 123 is disposed on the insulating layer 121. The conductive layer 124 is disposed in the insulating layer 123. The conductive layer 124 is in contact with and electrically connected to the conductive via 122. In some embodiments, the insulating layers 121 and 123 are collectively referred to as an IMD layer. In some embodiments, the conductive via 122 and the conductive layer 124 are formed by a dual damascene process. The insulating layers 121, 123 are laterally covering the conductive via 122 and the conductive layer 124 to constitute a build-up layer (Mn; not labeled) or a part of a build-up layer.

In some embodiments, the conductive layer 124 of the logic region LR is located at the same level with the conductive layer 124 of the memory region MR. In some embodiments, a height of the conductive via 122 of the logic region LR is different from a height of the conductive via 122 in the memory region MR.

In some embodiments, the insulating layers 111, 113, 115, 117, 121 and 123 are independently made of a dielectric material, such as silicon oxide, silicon nitride, silicon oxynitride, a spin-on dielectric material, or a low-k dielectric material. The conductive layers 114, 118, 124 each may be a conductive trace/line/wire. The conductive layers 114, 118, 124 and the conductive vias 112, 116, 122 may independently include metals or metal alloys including one or more of Al, AlCu, Cu, Ti, TiN, W, or the like. The conductive layers 114, 118 and 124 and the conductive vias 112, 116, 122 are a portion of a current driving circuit (not shown) to provide voltages to the memory cell 200. In some embodiments, the memory cell 200 may be disposed between any two adjacent conductive layers in the back-end-of-line (BEOL) structure. In certain embodiments, the fabricating process of the memory cell 200 may be compatible with the BEOL process of the semiconductor device, thereby simplifying process steps and efficiently improving the integration density.

In accordance with some embodiments, a memory cell includes a dielectric structure, a storage element structure, and a top electrode. The storage element structure is disposed in the dielectric structure, and the storage element structure includes a first portion and a second portion. The first portion includes a first side and a second side opposite to the first side, where a width of the first side is less than a width of the second side. The second portion is connected to the second side of the first portion, where a width of the second portion is greater than the width of the first side. The top electrode is disposed on the storage element structure, where the second portion is disposed between the first portion and the top electrode.

In accordance with some embodiments, a semiconductor device includes a substrate, a first interconnect structure, a memory cell, and a second interconnect structure. The first interconnect structure is disposed on the substrate. The memory cell is disposed on the first interconnect structure, where the memory cell includes a memory structure and a top electrode. The memory structure is disposed on and electrically coupled to the first interconnect structure, and the memory structure includes a first portion and a second portion. The first portion includes a first side and a second side opposite to the first side, and a width of the first side is less than a width of the second side, where the first side is disposed between the first interconnect structure and the second side. The second portion is connected to the second side of the first portion, where a width of the second portion is greater than the width of the first side. The top electrode is disposed on the memory structure, where the second portion is disposed between the first portion and the top electrode. The second interconnect structure is disposed on the memory cell and electrically coupled to the top electrode.

In accordance with some embodiments, a method of manufacturing a memory cell includes the following steps: forming a dielectric structure comprising a first dielectric material and a second dielectric material; patterning the first dielectric material to form a first dielectric layer having a first via penetrating therethrough, the first via comprising a first top opening and a first bottom opening, and a width of the first bottom opening being less than a width of the first top opening; patterning the second dielectric material to form a second dielectric layer having a second via, the width of the first bottom opening being less than a width of the second via; forming a storage element structure in the first via and the second via, the storage element structure comprising a first portion disposed in the first via and a second portion disposed in the second via, the second portion connecting to the first portion; and forming a top electrode over the storage element structure, the second portion of the storage element structure being disposed between the first portion of the storage element structure and the top electrode.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A memory cell, comprising: a dielectric structure; a storage element structure, disposed in the dielectric structure, comprising: a first portion, comprising a first side and a second side opposite to the first side, a width of the first side being less than a width of the second side; and a second portion, connected to the second side of the first portion, a maximum width of the second portion being greater than the width of the first side, wherein a first horizontal surface of the storage element structure is substantially level with a second horizontal surface of the dielectric structure, and a third horizontal surface of the storage element structure is substantially level with a fourth horizontal surface of the dielectric structure, wherein the first horizontal surface is opposite to the third horizontal surface, and the second horizontal surface is opposite to the fourth horizontal surface; and a top electrode, disposed on the storage element structure, wherein the second portion is disposed between the first portion and the top electrode, and a width of the top electrode is greater than the maximum width of the second portion.

2. The memory cell of claim 1, wherein the dielectric structure comprises:
   a first dielectric layer, laterally covering the first portion of the storage element structure; and
   a second dielectric layer, laterally covering the second portion of the storage element structure, wherein the second dielectric layer is stacked on a top surface of the first dielectric layer,
   wherein a material of the first dielectric layer is different from a material of the second dielectric layer.

3. The memory cell of claim 2, wherein a sidewall of the first portion comprises a slant sidewall, and a first angle between the sidewall of the first portion and a bottom surface of the first dielectric layer is approximately ranging from 45° to 60°, and wherein the bottom surface of the first dielectric layer is opposite to the top surface of the first dielectric layer along a stacking direction of the first dielectric layer and the second dielectric layer.

4. The memory cell of claim 2, wherein the second portion comprises a third side and a fourth side opposite to the third side, the third side is connected to the second side, and the fourth side is substantially coplanar with a surface of the second dielectric layer distant away from the first dielectric layer.

5. The memory cell of claim 1, wherein the storage element structure further comprises a third portion connecting to the second portion, wherein the second portion is sandwiched between the first portion and the third portion, and the third portion is sandwiched between the second portion and the top electrode, wherein the third portion has a fifth side and a sixth side opposite to the fifth side, a width of the fifth side is less than a width of the sixth side, and the width of the sixth side is greater than the maximum width of the second portion.

6. The memory cell of claim 5, wherein the dielectric structure comprises:

a first dielectric layer, laterally covering the first portion of the storage element structure; and a second dielectric layer, laterally covering the second portion and the third portion of the storage element structure, wherein the second dielectric layer is stacked on the first dielectric layer, wherein a material of the first dielectric layer is different from a material of the second dielectric layer.

7. The memory cell of claim 6, wherein a sidewall of the third portion comprises a slant sidewall, and a second angle between the sidewall of the third portion and a plane including the fifth side is approximately ranging from 30° to 60°.

8. The memory cell of claim 1, further comprising:

a barrier layer, wrapping a sidewall and a bottom surface of the storage element structure;

a hard mask layer, disposed on the top electrode, wherein the top electrode is disposed between the hard mask layer and the storage element structure; and a protection layer, disposed on the hard mask layer and covering sidewalls of the top electrode and the hard mask layer.

9. The memory cell of claim 1, further comprising:

a selector, disposed on and electrically coupled to the top electrode, wherein a sidewall of the selector is substantially aligned with a sidewall of the top electrode, and the top electrode is sandwiched between the selector and the storage element structure.

10. A method of manufacturing a memory cell, comprising: forming a dielectric structure comprising a first dielectric material and a second dielectric material; patterning the first dielectric material to form a first dielectric layer having a first via penetrating therethrough, the first via comprising a first top opening and a first bottom opening, and a width of the first bottom opening being less than a width of the first top opening; patterning the second dielectric material to form a second dielectric layer having a second via, the width of the first bottom opening being less than a width of the second via; forming a storage element structure in the first via and the second via, the storage element structure comprising a first portion disposed in the first via and a second portion disposed in the second via, the second portion connecting to the first portion, wherein the first portion comprises a first side and a second side opposite to the first side, a width of the first side is less than a width of the second side, and a maximum width of the second portion being greater than the width of the first side, wherein a first horizontal surface of the storage element structure is substantially level with a second horizontal surface of the dielectric structure, and a third horizontal surface of the storage element structure is substantially level with a fourth horizontal surface of the dielectric structure, wherein the first horizontal surface is opposite to the third horizontal surface, and the second horizontal surface is opposite to the fourth horizontal surface; and forming a top electrode over the storage element structure, the second portion of the storage element structure being disposed between the first portion of the storage element structure and the top electrode, wherein a width of the top electrode is greater than the maximum width of the second portion.

11. The semiconductor device of claim 10, wherein the dielectric structure comprises:

a first dielectric layer, laterally covering the first portion of the memory structure; and a second dielectric layer, laterally covering the second portion of the memory structure, wherein the second dielectric layer is stacked on a top surface of the first dielectric layer, wherein a material of the first dielectric layer is different from a material of the second dielectric layer.

12. The semiconductor device of claim 11, wherein a sidewall of the first portion comprises a slant sidewall, and a first angle between the sidewall of the first portion and a bottom surface of the first dielectric layer is approximately ranging from 45° to 60°, and wherein the bottom surface of the first dielectric layer is opposite to the top surface of the first dielectric layer along a stacking direction of the first dielectric layer and the second dielectric layer.

13. The semiconductor device of claim 11, wherein the second portion comprises a third side and a fourth side opposite to the third side, the third side is connected to the second side, and the fourth side is substantially coplanar with a surface of the second dielectric layer distant away from the first dielectric layer.

14. The semiconductor device of claim 10, wherein the memory structure further comprises a third portion connecting to the second portion, wherein the second portion is sandwiched between the first portion and the third portion, and the third portion is sandwiched between the second portion and the top electrode, wherein the third portion has a fifth side and a sixth side opposite to the fifth side, a width of the fifth side is less than a width of the sixth side, and the width of the sixth side is greater than the maximum width of the second portion.

15. The semiconductor device of claim 14, wherein the dielectric structure comprises:

a first dielectric layer, laterally covering the first portion of the memory structure; and a second dielectric layer, laterally covering the second portion and the third portion of the memory structure, wherein the second dielectric layer is stacked on the first dielectric layer, wherein a material of the first dielectric layer is different from a material of the second dielectric layer.

16. The semiconductor device of claim 15, wherein a sidewall of the third portion comprises a slant sidewall, and a second angle between the sidewall of the third portion and a plane including the fifth side is approximately ranging from 30° to 60°.

17. A method of manufacturing a memory cell, comprising:

forming a dielectric structure comprising a first dielectric material and a second dielectric material;

patterning the first dielectric material to form a first dielectric layer having a first via penetrating therethrough, the first via comprising a first top opening and a first bottom opening, and a width of the first bottom opening being less than a width of the first top opening;

patterning the second dielectric material to form a second dielectric layer having a second via, the width of the first bottom opening being less than a width of the second via;

forming a storage element structure in the first via and the second via, the storage element structure comprising a first portion disposed in the first via and a second portion disposed in the second via, the second portion connecting to the first portion, wherein the first portion comprises a first side and a second side opposite to the first side, a width of the first side is less than a width of the second side, and a maximum width of the second portion being greater than the width of the first side, wherein a first horizontal surface of the storage element structure is substantially level with a second horizontal surface of the dielectric structure, and a third horizontal surface of the storage element structure is substantially level with a fourth horizontal surface of the dielectric structure, wherein the first horizontal surface is opposite to the second horizontal surface, and the third horizontal surface is opposite to the fourth horizontal surface; and forming a top electrode over the storage element structure, the second portion of the storage element structure being disposed between the first portion of the storage element structure and the top electrode, wherein a width of the top electrode is greater than the maximum width of the second portion.

18. The method of claim 17, wherein patterning the second dielectric material to form the second dielectric layer is prior to patterning the first dielectric material to form the first dielectric layer, wherein the first via and the second via are spatially communicated to each other, wherein a surface of the second portion is substantially coplanar to a surface of the second dielectric layer distant away from the first dielectric layer and a surface of the first portion at the first bottom opening is substantially coplanar to a surface of the first dielectric layer distant away from the second dielectric layer.

19. The method of claim 17, wherein patterning the second dielectric material to form the second dielectric layer is prior to patterning the first dielectric material to form the first dielectric layer, and wherein prior to forming the storage element structure in the first via and the second via, the method further comprises:

patterning the second dielectric layer to obtain a trench over the second via, the trench and the second via being spatially communicated with each other and together penetrating through the second dielectric layer,
wherein the trench comprises a second top opening and a second bottom opening, and a width of the second top opening is greater than a width of the second bottom opening and the width of the second via, and wherein forming a storage element structure in the first via and the second via comprises forming a storage element structure in the first via, the second via and the trench, and the storage element structure comprising a first portion disposed in the first via, a second portion disposed in the second via, and a third portion disposed in the trench, the second portion connecting to and sandwiched between the first portion and the third portion, wherein a surface of the third portion is substantially coplanar to a surface of the second dielectric layer distant away from the first dielectric layer and a surface of the first portion at the first bottom opening is substantially coplanar to a surface of the first dielectric layer distant away from the second dielectric layer.

20. The method of claim 19, wherein after forming a storage element structure in the first via, the second via and the trench, the method further comprises:

performing a planarizing process to remove the third portion to accessibly reveal the second portion of the storage element structure.

* * * * *